(12) United States Patent
Wang et al.

(10) Patent No.: US 8,707,316 B1
(45) Date of Patent: Apr. 22, 2014

(54) METHODS AND SYSTEMS FOR MISSION-DRIVEN QUALITY OF SERVICE MANAGEMENT

(75) Inventors: Guijun Wang, Issaquah, WA (US);
Jingwen Jin, Peoria, IL (US);
Changzhou Wang, Bellevue, WA (US);
Haiqin Wang, Redmond, WA (US)

(73) Assignee: The Boeing Company, Chicago, IL (US)

(*) Notice: Subject to any disclaimer, the term of this patent is extended or adjusted under 35 U.S.C. 154(b) by 164 days.

(21) Appl. No.: 13/344,458

(22) Filed: Jan. 5, 2012

(51) Int. Cl.
*G06F 9/50* (2006.01)

(52) U.S. Cl.
USPC .......... 718/103; 718/100; 718/104; 705/7.12; 705/7.22; 705/7.25; 705/7.26

(58) Field of Classification Search
USPC ................................................ 718/100, 104
See application file for complete search history.

(56) References Cited

U.S. PATENT DOCUMENTS

| | | | |
|---|---|---|---|
| 6,842,899 B2 * | 1/2005 | Moody et al. ................. | 718/100 |
| 7,299,383 B2 * | 11/2007 | David et al. .................... | 714/51 |
| 2005/0204054 A1 * | 9/2005 | Wang et al. .................... | 709/232 |
| 2006/0253311 A1 * | 11/2006 | Yin et al. ........................ | 705/8 |
| 2008/0066072 A1 * | 3/2008 | Yurekli et al. ................. | 718/104 |
| 2009/0281977 A1 * | 11/2009 | Allen et al. .................... | 706/47 |
| 2011/0004885 A1 * | 1/2011 | Kikuchi et al. ................ | 718/104 |
| 2011/0246998 A1 * | 10/2011 | Vaidya et al. .................. | 718/103 |
| 2011/0292792 A1 * | 12/2011 | Zuo et al. ...................... | 370/230 |
| 2012/0265324 A1 * | 10/2012 | Colombo et al. .............. | 700/29 |

OTHER PUBLICATIONS

Berthomieu, B. et al., "Modeling and verification of time dependent systems using time Petri nets", 1991, IEEE Transactions on Software Engineering, vol. 17, Issue: 3, pp. 259-273.*
W. M. P. van der Aalst, "Petri net based scheduling", 1996, Operations-Research-Spektrum, vol. 18, Issue 4, pp. 219-229.*
Peres, Leticia Mara; Kunzle, Luis Allan and Todt, Eduardo. "Applying global time Petri net analysis on the embedded software context". Sba Controle & Automação [online]. 2011, vol. 22, n. 6, pp. 610-619.*
Yamalidou et al., "Feedback Control of Petri Nets Based on Place Invariants", 1996, Automatica, vol. 32, No. 1, pp. 15-28.*
F. Vernadat, "Manufacturing Systems Modelling, Specification and Analysis", Mar. 21-24, 1994, IFIP WG5.7 Working Conference on Evaluation of Production Management Methods, Porto Alegre/Gramado, Brasil.*
Wikipedia Contributors, "Petri net", Jan. 5, 2012, 11 pages, Wikipedia, The Free Encyclopedia.

* cited by examiner

*Primary Examiner* — Farid Homayounmehr
*Assistant Examiner* — Zhimei Zhu
(74) *Attorney, Agent, or Firm* — Armstrong Teasdale LLP

(57) ABSTRACT

Method and apparatus including processes, mechanisms, and devices for use with a networked mission system. The method includes receiving a mission representation including a plurality of actions in a mission and temporal and functional associations between the actions, wherein the actions are to be executed using a plurality of computing nodes. A Time Petri Net (TPN) model of the mission is generated based on the mission representation. The TPN model represents the actions in the mission, temporal constraints for the actions, and functional associations between the actions. An importance value and an urgency value associated with each action are determined based on the TPN model. One or more QoS policies are generated based on the importance values and the urgency values of the actions, wherein the QoS policies are applied to the computing nodes.

27 Claims, 15 Drawing Sheets

METHODS AND SYSTEMS FOR MISSION-DRIVEN QUALITY OF SERVICE MANAGEMENT

BACKGROUND

The field of the disclosure relates generally to mission systems in networked environments (distributed mission systems), and more specifically, to quality of service (QoS) management in such systems.

A distributed mission system is a computing and communication system that supports critical missions on a distributed system including a plurality of computing nodes (e.g., a few to hundreds or even thousands of nodes). Certain distributed mission systems are called networked mission critical systems (NMCSs), as they have stringent requirements in performance, reliability, availability, scalability, security, and maintainability. Examples of NMCSs include finance (e.g., banking) systems, enterprise production support systems, flight management systems, space exploration systems, battle command mission systems, combat systems, power grid management systems, disaster response systems, and/or humanitarian relief systems.

A mission includes actions (also referred to herein as "tasks") which may be assigned to people and/or autonomous agents, with functional and temporal associations between these actions. In an NMCS, mission actions are allocated and executed on distributed computing and communication nodes. In a manned mission, people work on the actions in a collaborative fashion to accomplish the mission. In an unmanned mission, actions are allocated to distributed systems and executed autonomously in a collaborative fashion to accomplish a mission. A mixture of manned and unmanned systems would have both people working on actions and systems executing actions autonomously.

At least some known network systems, including NMCSs, use QoS policies to achieve a desired level of performance, such as a minimum bandwidth or a maximum latency. In a policy-based approach, strategies and decisions for admission control, resource management, monitoring and adaptation are encoded in policies. Policies specify what decisions should be taken under what conditions. Runtime services load and utilize the policies to make QoS management decisions. Decisions may include admission criteria, task priority, information flow weight, bandwidth allocation, information flow to queue mapping, queue size, etc. Decisions may also include adaptations as changes to admission criteria, priority setting, and weight assignment, etc. In this approach, policies can be changed over time without software code changes in runtime services, enabling a flexible and easy-to-maintain QoS management solution.

However, one shortcoming of a conventional policy-based approach is that the policies are created and updated manually by human experts rather than being automatically derived from mission requirements. This introduces manual effort as well as a potential for delay and human error. It is also difficult to update and respond to changes in the missions it supports. Further, such an approach does not scale well to large scale complex distributed mission systems. Over time, it becomes more and more challenging to understand the rationale and optimality of such policies, such as who defined them, on what the policy definitions are based, and why the policies are advantageous to the mission. Accordingly, it would be advantageous to provide methods and systems that derive formal mission models and automatically generate QoS management policies for missions based on the formal models.

BRIEF DESCRIPTION

In one aspect, a method for use with a networked mission system is provided. The method includes receiving, by a computing device, a mission representation including a plurality of actions in a mission and temporal and functional associations between the actions, wherein the actions are to be executed using a plurality of computing nodes. The computing device generates a Time Petri Net (TPN) model of the mission based on the mission representation, wherein the TPN model represents the actions in the mission, temporal constraints for the actions, and functional associations between the actions. The computing device also determines an importance value and an urgency value associated with each action based on the TPN model, and generates one or more QoS policies based on the importance values and the urgency values of the actions, wherein the QoS policies are applied to the computing nodes.

In another aspect, a device for use with a networked mission system is provided. The device includes a memory and a processor unit coupled to the memory. The memory stores a mission representation including a plurality of actions in a mission and temporal and functional associations between the actions. The actions are to be executed using a plurality of computing nodes. The processor unit is programmed to generate a Time Petri Net (TPN) model of the mission based on the mission representation, wherein the TPN model represents the actions in the mission, temporal constraints for the actions, and functional associations between the actions. The processor unit is also programmed to determine an importance value and an urgency value associated with each action based on the TPN model, and to generate one or more QoS policies based on the importance values and the urgency values of the actions, wherein the QoS policies are applied to the computing nodes.

In yet another aspect, a storage device having embodied thereon computer-executable instructions is provided. When executed by a processor unit, the computer-executable instructions cause the processor unit to receive a mission representation including a plurality of actions in a mission and temporal and functional associations between the actions, wherein the actions are to be executed using a plurality of computing nodes. The computer-executable instructions also cause the processor unit to generate, by the processor unit, a Time Petri Net (TPN) model of the mission based on the mission representation, wherein the TPN model represents the actions in the mission, temporal constraints for the actions, and functional associations between the actions. The computer-executable instructions further cause the processor unit to determine, by the processor unit, an importance value and an urgency value associated with each action based on the TPN model, and to generate, by the processor unit, one or more QoS policies based on the importance values and the urgency values of the actions, wherein the QoS policies are applied to the computing nodes.

The features, functions, and advantages that have been discussed can be achieved independently in various embodiments or may be combined in yet other embodiments further details of which can be seen with reference to the following description and drawings.

DETAILED DESCRIPTION

Methods and systems described herein manage Quality of Service (QoS) using Time Petri Net (TPN) models for networked mission critical systems (NMCSs), deriving, enforcing, and/or adapting QoS policies based on mission requirements.

In exemplary embodiments, mission actions and the functional and temporal associations between such actions are automatically extracted from a mission representation and represented in a formal TPN model by a Mission Compiler. QoS policies are derived by a Mission QoS Reasoner based on the TPN model using reasoning techniques to determine the urgency and importance values of individual actions. The correctness and traceability of runtime actions to mission requirements are provided through formal models and reasoning techniques. QoS policies are seamlessly and in real time communicated to the runtime QoS management system on distributed systems for enforcement.

Figure 1:
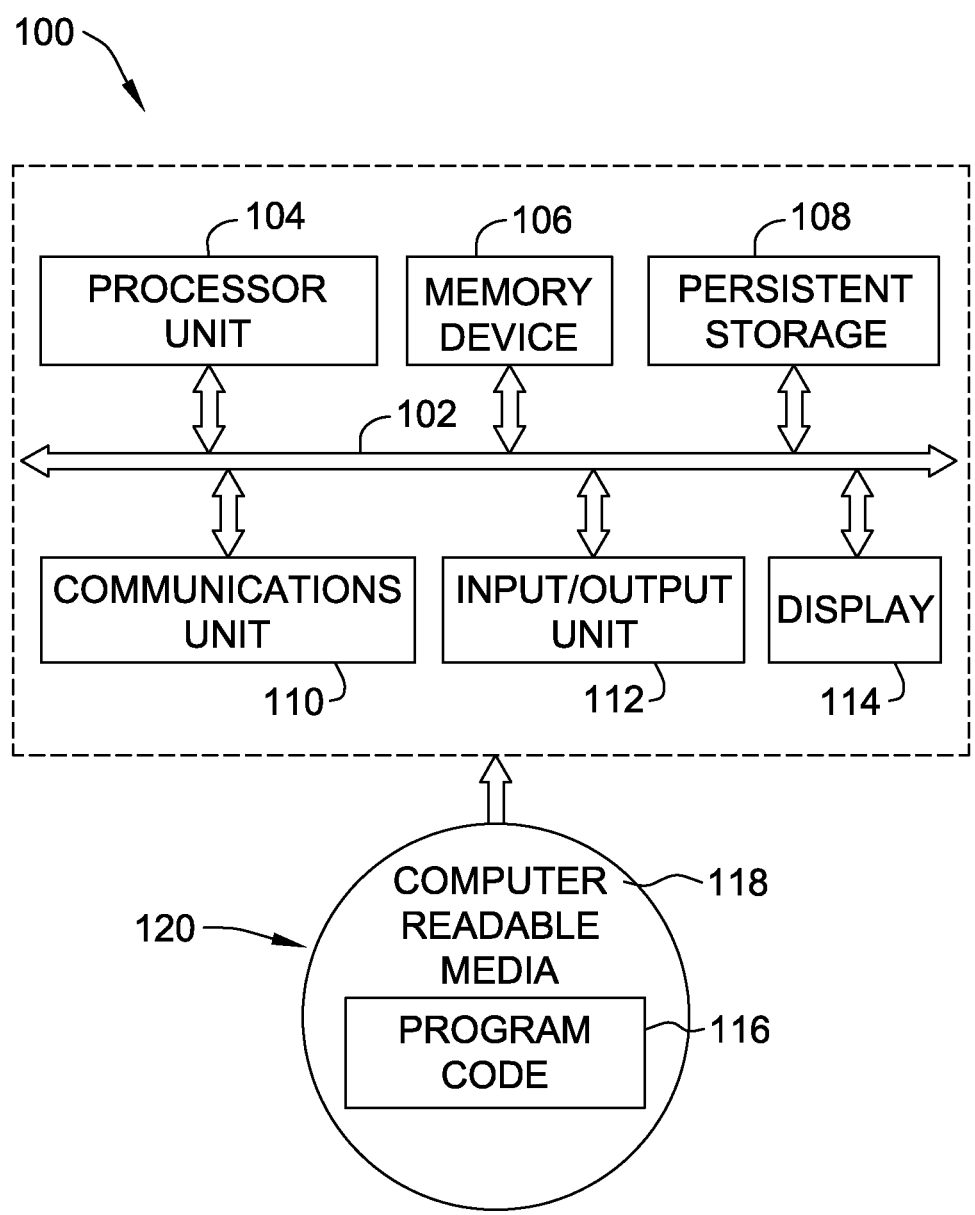
FIG. 1 is a block diagram of an exemplary computing device.

Exemplary embodiments are implemented using computing devices. FIG. 1 is a block diagram of an exemplary computing device 100. In the exemplary embodiment, computing device 100 includes communications fabric 102 that provides communications between a processor unit 104, a memory 106, persistent storage 108, a communications unit 110, an input/output (I/O) unit 112, and a presentation interface, such as a display 114. In addition to, or in alternative to, the presentation interface may include an audio device (not shown) and/or any device capable of conveying information to a user.

Processor unit 104 executes instructions for software that may be loaded into a storage device (e.g., memory 106). Processor unit 104 may be a set of one or more processors or may include multiple processor cores, depending on the particular implementation. Further, processor unit 104 may be implemented using one or more heterogeneous processor systems in which a main processor is present with secondary processors on a single chip. In another embodiment, processor unit 104 may be a homogeneous processor system containing multiple processors of the same type.

Memory 106 and persistent storage 108 are examples of storage devices. As used herein, a storage device is any tangible piece of hardware that is capable of storing information either on a temporary basis and/or a permanent basis. Memory 106 may be, for example, without limitation, a random access memory and/or any other suitable volatile or non-volatile storage device. Persistent storage 108 may take various forms depending on the particular implementation, and persistent storage 108 may contain one or more components or devices. For example, persistent storage 108 may be a hard drive, a flash memory, a rewritable optical disk, a rewritable magnetic tape, and/or some combination of the above. The media used by persistent storage 108 also may be removable. For example, without limitation, a removable hard drive may be used for persistent storage 108.

A storage device, such as memory 106 and/or persistent storage 108, may be configured to store data for use with the processes described herein. For example, a storage device may store (e.g., have embodied thereon) computer-executable instructions, executable software components (e.g., a Mission Compiler, a QoS Reasoner, a Mission Coordinator, and/or other components described herein), mission representations, Time Petri Net models, QoS policies, and/or any other information suitable for use with the methods described herein. When executed by a processor (e.g., processor unit 104), such computer-executable instructions and/or components cause the processor to perform one or more of the operations described herein.

Communications unit 110, in these examples, provides for communications with other computing devices or systems. In the exemplary embodiment, communications unit 110 is a network interface card. Communications unit 110 may provide communications through the use of either or both physical and wireless communication links.

Input/output unit 112 enables input and output of data with other devices that may be connected to computing device 100. For example, without limitation, input/output unit 112 may provide a connection for user input through a user input device, such as a keyboard and/or a mouse. Further, input/output unit 112 may send output to a printer. Display 114 provides a mechanism to display information, such as any information described herein, to a user. For example, a presentation interface such as display 114 may display a graphical user interface, such as those described herein.

Instructions for the operating system and applications or programs are located on persistent storage 108. These instructions may be loaded into memory 106 for execution by processor unit 104. The processes of the different embodiments may be performed by processor unit 104 using computer implemented instructions and/or computer-executable instructions, which may be located in a memory, such as memory 106. These instructions are referred to herein as program code (e.g., object code and/or source code) that may be read and executed by a processor in processor unit 104.

The program code in the different embodiments may be embodied on different physical or tangible computer-readable media, such as memory 106 or persistent storage 108.

Program code 116 is located in a functional form on non-transitory computer-readable media 118 that is selectively removable and may be loaded onto or transferred to computing device 100 for execution by processor unit 104. Program code 116 and computer-readable media 118 form computer program product 120 in these examples. In one example, computer-readable media 118 may be in a tangible form, such as, for example, an optical or magnetic disc that is inserted or placed into a drive or other device that is part of persistent storage 108 for transfer onto a storage device, such as a hard drive that is part of persistent storage 108. In a tangible form, computer-readable media 118 also may take the form of a persistent storage, such as a hard drive, a thumb drive, or a flash memory that is connected to computing device 100. The tangible form of computer-readable media 118 is also referred to as computer recordable storage media. In some instances, computer-readable media 118 may not be removable.

Alternatively, program code 116 may be transferred to computing device 100 from computer-readable media 118 through a communications link to communications unit 110 and/or through a connection to input/output unit 112. The communications link and/or the connection may be physical or wireless in the illustrative examples. The computer-readable media also may take the form of non-tangible media, such as communications links or wireless transmissions containing the program code.

In some illustrative embodiments, program code 116 may be downloaded over a network to persistent storage 108 from another computing device or computer system for use within computing device 100. For instance, program code stored in a computer-readable storage medium in a server computing device may be downloaded over a network from the server to computing device 100. The computing device providing program code 116 may be a server computer, a workstation, a client computer, or some other device capable of storing and transmitting program code 116.

Program code 116 may be organized into computer-executable components that are functionally related. For example, program code 116 may include one or more part agents, ordering manager agents, supplier agents, and/or any component suitable for practicing the methods described herein. Each component may include computer-executable instructions that, when executed by processor unit 104, cause processor unit 104 to perform one or more of the operations described herein.

The different components illustrated herein for computing device 100 are not meant to provide architectural limitations to the manner in which different embodiments may be implemented. The different illustrative embodiments may be implemented in a computer system including components in addition to or in place of those illustrated for computing device 100. For example, other components shown in FIG. 1 can be varied from the illustrative examples shown.

As one example, a storage device in computing device 100 is any hardware apparatus that may store data. Memory 106, persistent storage 108 and computer-readable media 118 are examples of storage devices in a tangible form.

In another example, a bus system may be used to implement communications fabric 102 and may include one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, without limitation, memory 106 or a cache such as that found in an interface and memory controller hub that may be present in communications fabric 102.

QoS generally refers to perceived or measured quality parameters that clients receive from service providers, specified in terms such as criticality and urgency of data being communicated, and in more detailed, decomposed technical parameters such as response time, throughput, deadline, priority, guarantee, ordering, frame rate, and jitter. QoS management refers to activities involved in ensuring a system provides services to client applications according to agreed QoS parameters through resource allocations and control mechanisms. QoS management provides strategies, mechanisms, and algorithms to enable networked systems to deliver desired outcomes for the concurrent actors (e.g., users and applications) in a NMCS, despite differences in QoS characteristics (e.g., performance, reliability, timeliness, and security) associated with the different actors.

Figure 2:
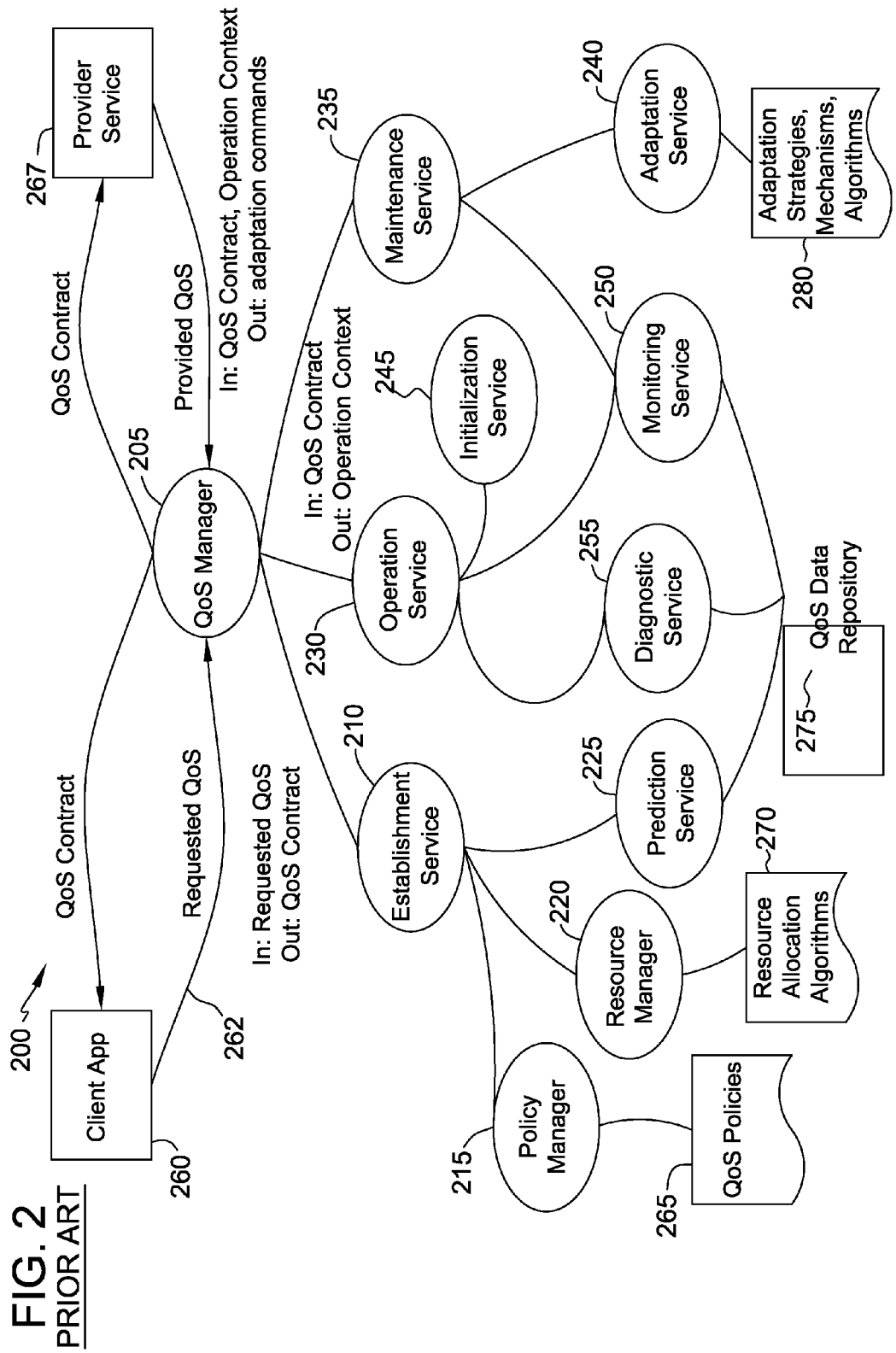
FIG. 2 is a block diagram illustrating an exemplary QoS management architecture.

FIG. 2 is a block diagram illustrating an exemplary known QoS management architecture 200. Architecture 200 may operate as described in U.S. Pat. No. 8,046,464, issued 25 Oct. 2011 to Guijun Wang et al., which is hereby incorporated by reference in its entirety.

Architecture 200 includes a plurality of executable software components that are executed by one or more computing devices 100 (shown in FIG. 1). As shown in FIG. 2, the executable software components include a QoS manager 205, an Establishment Service 210, a Policy Manager 215, a Resource Manager 220, a Prediction Service 225, an Operation Service 230, a Maintenance Service 235, an Adaptation Service 240, an Initialization Service 245, a Monitoring Service 250, and a Diagnostic Service 255.

In exemplary embodiments, QoS Manager 205 provides an interface to a client 260 (e.g., a software application at a computing device 100) for QoS contract negotiation. QoS Manager 205 receives a request from client 260 for requested QoS parameters 262 with respect to data processing by the system and data transmitted by and/or to client 260. QoS parameters may include values or range of values, for example, response time, bandwidth, and latency. QoS policies 265 determines whether a client's request can be granted or not (admission control), and if it can be granted, at what level of QoS parameters can be provided by the system. An agreeable set of QoS parameters between a client and the system is defined in a QoS contract. QoS Manager 205 coordinates the establishment and maintenance of QoS contracts and enforces QoS policies 265, as described in more detail below.

QoS Manager 205 provides the QoS parameters in the request from client 260 to Establishment Service 210, which establishes a QoS contract based on the QoS policies 265 of the system. Establishment Service 210 provides the QoS contract to QoS Manager 205, which forwards the QoS contract to both client 260 and a Provider Service 267. In some embodiments, the QoS contract may be established by negotiations. For example, if the QoS parameters requested by client 260 cannot be satisfied (e.g., due to insufficient resources), QoS Manager 205 may transmit a negative response to client 260, and client 260 may transmit another request 262 with a different set of QoS parameters (e.g., requiring less resources).

Policy Manager 215 provides admission control, resource management, monitoring, and adaptation strategies for the system. The Policy Manager 215 may deny a client's request to utilize the system in certain situations such as when the system is overloaded and the client's priority is low. If a client's request is denied, no QoS contract is created. Resource Manager 220 manages the lifecycle (e.g., reservation, allocation, and release) of network, memory, and CPU resources (e.g., bandwidth, queue, and priority) using resource allocation algorithms 270. Prediction Service 225 predicts future resource usage by nodes in the network, either for some resources on the local node or the whole system, and with or without perturbation of the network.

Operation Service 230 coordinates the assessment of the status of the execution of the QoS contracts in the system, interacting with Initialization Service 245, Monitoring Service 250, and Diagnostic Service 255. Initialization Service 245 coordinates the start or activation of services for enforcing QoS contracts. Monitoring Service 250 monitors performance metrics (e.g., latency, throughput, and/or dropped packets) within the network, contract health (e.g., compliance), and system conditions given by Diagnostic Service 255. Diagnostic Service 255 aggregates real-time inputs from system monitoring tools to generate high-level system condition information, such as latency and/or bandwidth at endpoints outside the network, CPU load, and network congestion. Monitoring Service 250 and Diagnostic Service 255 store monitored information in a QoS Data Repository 275.

Maintenance Service 235, which communicates with Adaptation Service 240 and Monitoring Service 250, maintains the QoS guarantee level for each contract. Adaptation Service 240 changes resource settings based on adaptation strategies, mechanisms, and algorithms 280 to maintain QoS parameters within normal ranges, and/or to provide graceful degradation (e.g., minor and/or gradual deviations from QoS policies) for contract violations that are unavoidable.

QoS management may be implemented in various ways, including quota-based approaches and policy-based approaches. In a quota-based approach, resources are allocated to tasks based on pre-determined quotas. Such approaches may be applied to closed execution environments where tasks and runtime conditions are deterministic. In a policy-based approach, resources are allocated based on policies (e.g., QoS policies 265) and runtime system and network conditions, and policies can be changed without changing runtime software services (e.g., executable code). However, policies are typically created from human expert knowledge, such as some fixed decision rules.

A policy-based QoS management approach uses declarative QoS policies to determine resource allocations and control mechanisms at runtime. However, creation of QoS policies by human users, even experts, is time-consuming and error-prone, especially in the context of a mission with a large number of actions and complex functional and temporal associations among the actions. Furthermore, it is difficult for QoS policies to be traceable to ever-changing missions and to ensure mission requirements are correctly satisfied. Rather, policies may be days or months old by the time of deployment and thus infeasible or impossible to optimize to real-time situation changes and dynamic mission needs. Embodiments described herein provide an approach for automated creation of improved ("optimal") QoS policies, which enable runtime decisions that trace to the policies and policies that trace back to mission requirements, and a QoS management system that responds to mission changes in near real-time.

A mission includes actions (also known as tasks) assigned to people and/or autonomous agents, associations between the actions, and properties of the actions and/or associations. Execution of a mission is achieved by executing sequences of actions that accomplish the objectives of the mission. These actions have functional and temporal associations among each other. As described herein, those associations may serve as the basis for deriving mission QoS policies.

The Mission-driven QoS Management Architecture described herein includes two subsystems: a Mission QoS Derivation subsystem (e.g., implemented as system 300, shown in FIG. 3) and a QoS Management subsystem (e.g., implemented as architecture 200, shown in FIG. 2). The Mission QoS Derivation subsystem further includes three main components: a Mission Compiler, a Mission QoS Reasoner, and a Mission Coordinator, described in more detail below.

Exemplary embodiments of a Mission-driven QoS Management Approach for Networked Mission Critical System (NMCS) use Time Petri Nets (TPN) as a formal basis and automatically extracts and represents mission actions and their temporal and functional associations in TPN models. The TPN models provide the basis for reasoning about the urgencies on the actions in the mission. The approach also uses the functional associations of the actions to reason about the importance of the actions in accomplishing the mission objectives. Based on the reasoning of the urgency and importance of actions in a mission, the approach automatically derives the set of QoS policies for the mission. Finally, the approach provides a method of near real-time dissemination and enforcement of the derived policies.

The Mission-driven QoS Management approach, which builds on top of the policy-based approach, involves a method, an architecture, processes, and a set of algorithms and techniques for automating the creation of optimal QoS policies through formal mission models, reasoning, and mathematical analysis. In exemplary embodiments, QoS policies are derived from inherent actions and their functional and temporal associations in a mission autonomously and are responsive to dynamic changes in mission needs (e.g., by re-generating the QoS policies). Accordingly, exemplary embodiments not only reduce human labor cost, but also derive and optimize QoS policies in near real-time, based on the actions and their functional and temporal associations in a mission. (As used herein, "near real-time" refers to a time scale of milliseconds to seconds depending on complexity of a mission.)

In exemplary embodiments, a mission-driven QoS management approach derives, enforces, and adapts optimal QoS policies based on mission requirements. Mission actions and their functional and temporal associations are automatically extracted and represented in formal models by a Mission Compiler, and optimal QoS policies are derived from the formal models by a Mission QoS Reasoner using reasoning techniques. The correctness and traceability of runtime actions to mission requirements are provided through formal models and reasoning techniques. QoS policies are seamlessly and in near real-time communicated to the runtime QoS management system on distributed systems for enforcement.

As the mission or the mission phase changes, the Mission Compiler and Mission QoS Reasoner are able to quickly and automatically derive a new set of QoS policies that meet the mission requirements. QoS policies are enforced as in a policy-based approach. Because of the rigorous formal models and formal reasoning techniques, the mission-driven QoS management approach can autonomously derive the QoS policies in near real-time and ensure the correctness and traceability of runtime actions to mission QoS policies. As mission QoS policies are generated based on formal models, they are traceable to the mission requirements inherent in the mission representation. As a result, this mission-driven QoS management approach enables a responsive and traceable approach to QoS management.

Figure 3:
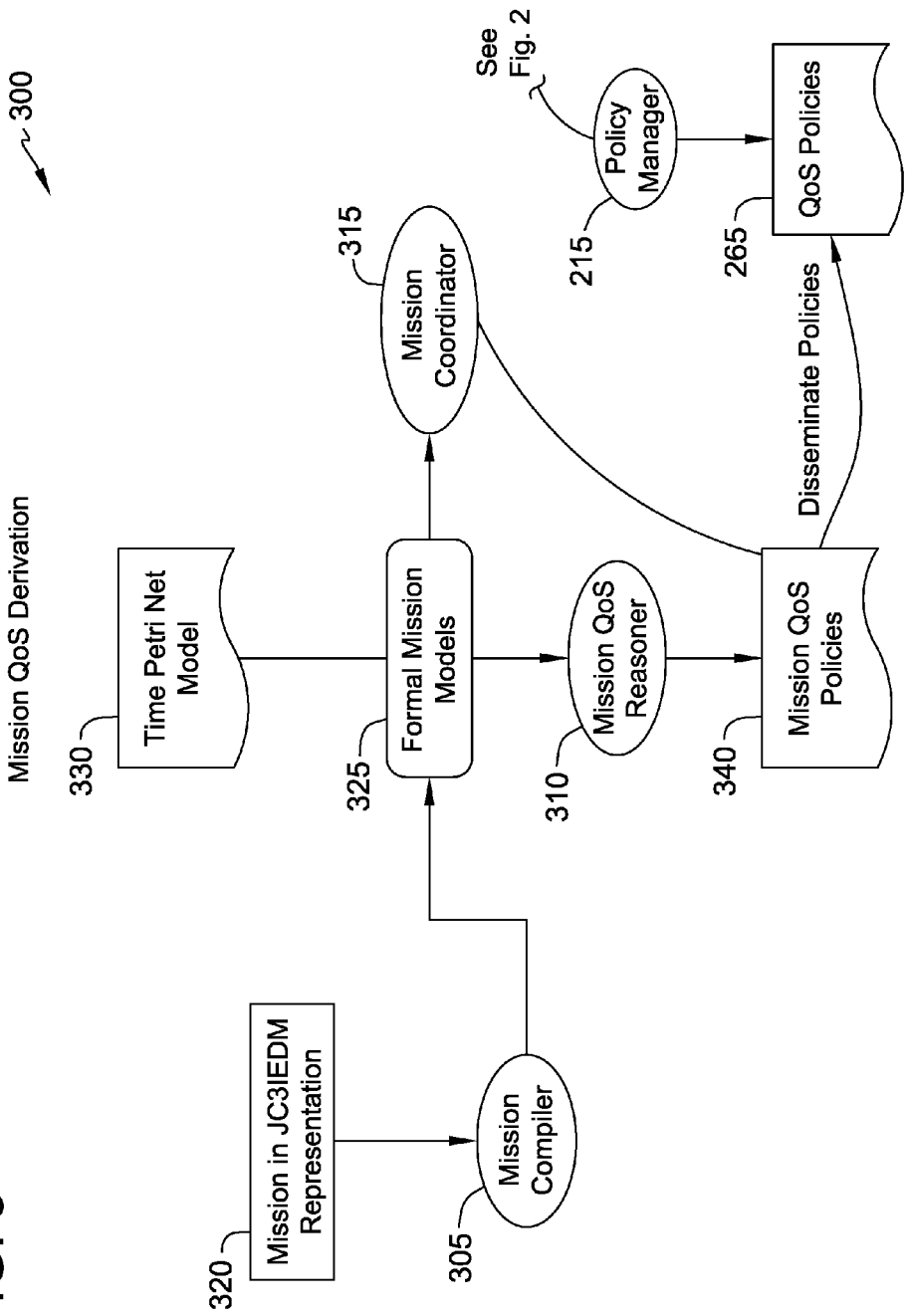
FIG. 3 is a block diagram of an exemplary Mission-driven QoS Management system including a Mission Compiler, a Mission QoS Reasoner, and a Mission Coordinator.

FIG. 3 is a block diagram of an exemplary Mission-driven QoS Management system 300 including a Mission Compiler 305, a Mission QoS Reasoner 310, and a Mission Coordinator 315, which may be implemented as computer-executable components executed by one or more computing devices, as described above with reference to FIG. 1.

Mission Compiler 305 performs mission analysis and model generation. Mission Compiler 305 systematically analyzes a mission definition or representation 320 and generates formal mission models 325, such as a Time Petri Net (TPN) model 330 of the mission, based on mission representation 320. While reference is made herein to a mission representation specified using the JC3IEDM standard, the methods described are applicable to any other mission representations.

Based on TPN model 330, Mission QoS Reasoner 310 infers the importance and urgency properties of the actions, and generates QoS policies 340 for controlling the admission, resource allocation, and/or adaptation of mission execution for the mission described by mission representation 320. Mission Coordinator 315 disseminates QoS policies 340 to the nodes (e.g., computing devices 100, shown in FIG. 1) of the NMCS. For example, Mission Coordinator 315 may copy QoS policies 340 to QoS policies 265, which are used by Policy Manager 215, as described above with reference to FIG. 2. QoS policies 265 are then enforced by the runtime QoS Management services on the nodes of the NMCS in real time. Such embodiments enable an automated, generative, self-adaptive QoS management approach responsive to mission needs and evolving situations.

Initial Mission Representation

For purposes of illustration, an example of a search and rescue mission for a hostage rescue scenario is described below. The mission is divided into 4 phases: detect, deploy, rescue, and secure, with each such phase consisting of multiple actions and, potentially, sub-actions.

Figure 4:
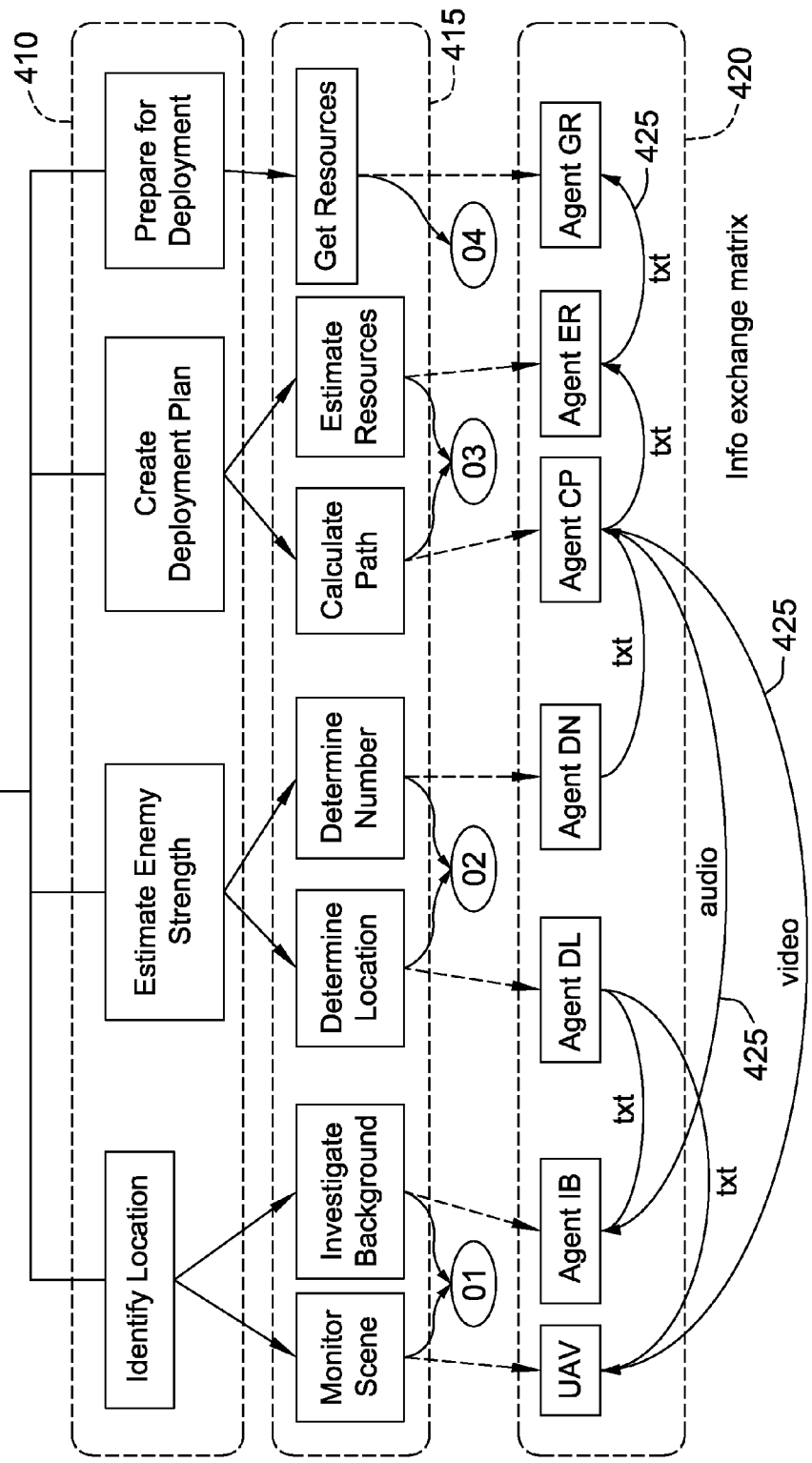
FIG. 4 is an illustration of a detect phase of a search and rescue mission.

FIG. 4 is an illustration of a detect phase 405 of a search and rescue mission. As shown in FIG. 4, detect phase 405 includes four main actions 410 (depicted in the top layer of the hierarchy), which in turn include finer-grained sub-actions 415. Each action is associated with a mission objective (e.g., O1, O2, O3, and O4), and each leaf-level (e.g., having no children in the hierarchy) sub-action 415 is assigned to an executing entity (e.g., a person or an autonomous agent) 420 for performing the sub-action. In FIG. 4, the association between a leaf-level sub-action and an executing entity 420 is represented by a dotted line. Executing entities 420 exchange data, as represented by arcs 425

Figure 5:
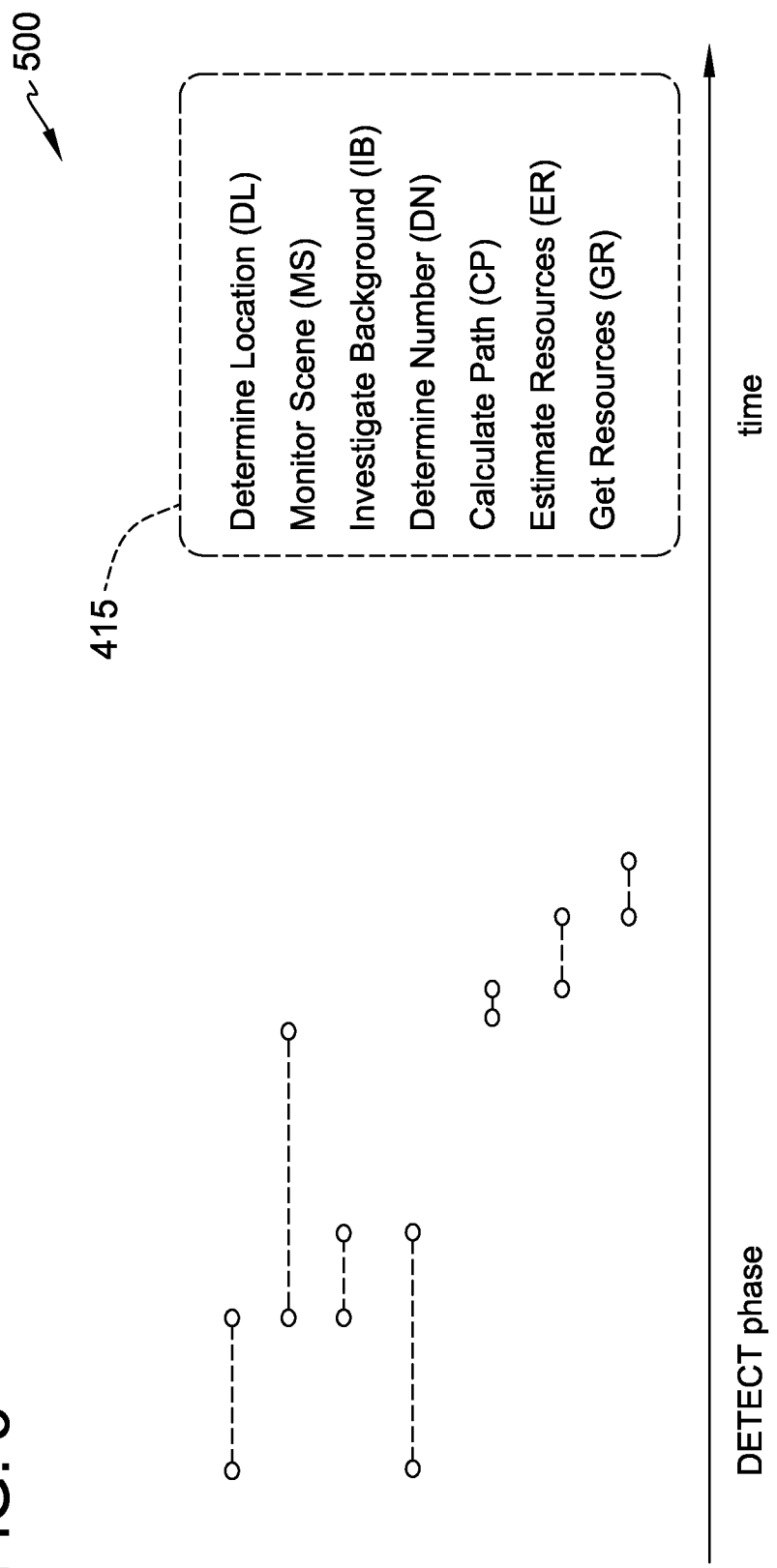
FIG. 5 is a chart depicting temporal associations among the sub-actions in the detect phase shown in FIG. 4.

FIG. 5 is a chart 500 depicting temporal associations among the sub-actions 415 in the detect phase 405 (shown in FIG. 4). The temporal associations are presented in a tabular format in Table 1.

TABLE 1

| Subject Action | Object Action | Temporal Association | |
|---|---|---|---|
| MS | DL | STREND | (starts after end of) |
| IB | DL | STREND | (starts after end of) |
| DN | DL | STRSTR | (starts after start of) |
| CP | MS | STREND | (starts after end of) |
| CP | IB | STREND | (starts after end of) |
| CP | DN | STREND | (starts after end of) |
| ER | CP | STREND | (starts after end of) |
| GR | ER | STREND | (starts after end of) |

Among the actions, both monitor scene (MS) and investigate background (IB) rely on the result (enemy location) of determine location (DL). Accordingly MS and IB start after DL, indicated by a temporal association of STREND from both MS and IB to DL. On the other hand, determine enemy number (DN) is not dependent on enemy location. Therefore, rather than starting after the end of DL, DN may start after the start of DL, as indicated by a temporal association of STR-STR from DN to DL. The action calculate path (CP) waits until MS, IB, and DN have been finished before it starts. Therefore, CP has a STREND association with MS, IB, and DN. Once CP is complete, then estimate resources (ER) can be started, and once ER is complete, the get resources (GR) action can be performed (i.e., GR starts after the end of ER).

The JC3IEDM data model uses an XML-based representation to encode a mission. In the JC3IEDM model, a mission is represented by a series of action tasks that are to be executed in the sphere of operations. Each action task has an activity code to define the type of the task. Optionally, duration information of a task can be specified by minimal duration, maximal duration, or estimated duration. The absolute starting and ending times, effect, objective, and associated organization of an action task can also be specified if needed. Further, functional dependence and temporal dependence between two tasks can be specified by a standard code, which corresponds to a unique type of dependence association. Additional details of such functional associations and temporal associations are described below.

Listing 1 is an illustrative portion of an exemplary JC3IEDM mission representation of the search and rescue mission described above. Listing 1 includes only two of the seven actions, DL and MS, one temporal association, and two functional associations, shown in the mission "detect" phase.

LISTING 1

```
<?xml version="1.0" encoding="UTF-8"?>
<JC3IEDM xmlns="urn:int:nato:standard:mip:jc3iedm:3.0.2:oo:2.2"
    xmlns:xsi="http://www.w3.org/2001/XMLSchema-instance"
    xsi:schemaLocation="urn:int:nato:standard:mip:jc3iedm:3.0.2:oo:2.2
    schema/ws-oo/JC3IEDM-3.0.2-RootIntegrityChecks-20090514.xsd">
  <OtherActionTask>
    <OID>DL</OID>
    <CreatorId>Org001</CreatorId>
    <NameText>DetermineLocation</NameText>
    <ActionFunctionalAssociationInSubjectAction>
      <ObjectActionRef>
        <OID>DN</OID>
      </ObjectActionRef>
      <ActionFunctionalAssociation>
        <OID>FUNC-DL-DN</OID>
        <CreatorId>Org001</CreatorId>
        <CategoryCode>HASSEC</CategoryCode>
      </ActionFunctionalAssociation>
    </ActionFunctionalAssociationInSubjectAction>
    <ResourceRef>
      <OID>AgentDL</OID>
    </ResourceRef>
    <ActivityCode>ACQUIR</ActivityCode>
    <EstimatedDuration>40</EstimatedDuration>
    <CategoryCode>ORD</CategoryCode>
  </OtherActionTask>
  <OtherActionTask>
    <OID>MS</OID>
    <CreatorId>Org001</CreatorId>
    <NameText>MonitorScene</NameText>
    <ActionFunctionalAssociationInSubjectAction>
      <ObjectActionRef>
        <OID>IB</OID>
      </ObjectActionRef>
      <ActionFunctionalAssociation>
        <OID>FUNC-MS-IB</OID>
        <CreatorId>Org001</CreatorId>
        <CategoryCode>IOT</CategoryCode>
      </ActionFunctionalAssociation>
```

-continued

LISTING 1

```
      </ActionFunctionalAssociationInSubjectAction>
      <ActionTemporalAssociationInSubjectAction>
        <ObjectActionRef>
          <OID>DL</OID>
        </ObjectActionRef>
        <ActionTemporalAssociation>
          <OID>TEMP-MS-DL</OID>
          <CreatorId>Org001</CreatorId>
          <CategoryCode>STREND</CategoryCode>
          <ReferenceDuration>0</ReferenceDuration>
        </ActionTemporalAssociation>
      </ActionTemporalAssociationInSubjectAction>
      <ResourceRef>
        <OID>UAV</OID>
      </ResourceRef>
      <ActiyityCode>AEW</ActiyityCode>
      <EstimatedDuration>80</EstimatedDuration>
      <CategoryCode>ORD</CategoryCode>
    </OtherActionTask>
    <ActionResourceType>
      <OID>UAV</OID>
      <CreatorId>Org001</CreatorId>
      <Quantity>3</Quantity>
      <ObjectTypeRef>
        <OID>UAVType</OID>
      </ObjectTypeRef>
    </ActionResourceType>
    <ActionResourceType>
      <OID>AgentDL</OID>
      <CreatorId>Org001</CreatorId>
      <Quantity>1</Quantity>
      <ObjectTypeRef>
        <OID>AgentType</OID>
      </ObjectTypeRef>
    </ActionResourceType>
</JC3IEDM>
```

Mission Compiler Service

Referring to FIG. 3, Mission Compiler 305, using mission representation 320 as input, analyzes the actions and the functional and temporal associations between actions, and generates formal models 325 for the mission, such as Time Petri Net (TPN) models 330.

Functional associations represent decomposition of higher-level actions to lower-level actions as well as relative functional dependencies among the actions. Temporal associations represent the timeline among the actions. A mission could be very complex in terms of actions, associations, resource allocations (in units/teams, computing, communication, and/or equipments), and dynamisms. Manually interpreting such complex relationship is time-consuming and error-prone. Accordingly, Mission Compiler 305 automatically identifies within mission representation 320 functional and temporal associations, which may be referred to as ACTION-FUNCTIONAL-ASSOCIATION and ACTION-TEMPORAL-ASSOCIATION, respectively.

The concept of temporal associations is employed to specify relative time between actions. Relative time is particularly relevant when the absolute start times of actions are not explicitly specified. For example, Action A may start five minutes after Action B starts, and end at the same time that Action B ends, regardless of when the absolute times at which Action B starts and ends.

JC3IEDM has specified a total of 18 temporal associations between two actions, namely ENDEND, ENDENE, ENDENL, ENDSNE, ENDSNL, ENDSTR, SAEAST, SAENDO, SASTEA, SBEAST, SDUREA, SDUREB, STREND, STRENE, STRENL, STRSNE, STRSNL, and STRSTR. Timing constraints associated with actions (e.g., the start time and/or the end time) may be derived from mission representation 320 based on these temporal associations, as shown in Table 2.

TABLE 2

| Association Name Abbreviation | Description | Derived Constraint |
|---|---|---|
| ENDEND | The subject ACTION ends after the object ACTION ends. | $S_S > S_O + D_O - D_S$ |
| ENDENE | The subject ACTION ends no earlier than the end of the object ACTION augmented by a fixed duration. | $S_S >= S_O + D_O + d - D_S$ |
| ENDENL | The subject ACTION ends no later than the end of object ACTION augmented by a fixed duration. | $S_O >= S_S + D_S - D_O - d$ |
| ENDSNE | The subject ACTION ends no earlier than the start of the object ACTION augmented by a fixed duration. | $S_S >= S_O + d - D_S$ |
| ENDSNL | The subject ACTION ends no later than the start of object ACTION augmented by a fixed duration. | $S_O >= S_S + D_S - d$ |
| ENDSTR | The subject ACTION ends after the object ACTION starts. | $S_S >= S_O - D_S$ |
| SAEAST | The two ACTIONs are concurrent. | $S_S = S_O$ $D_O = D_S$ |
| SAENDO | The subject ACTION begins before the object ACTION and ends before the object ACTION ends. | $S_O > S_S$ $S_O > S_S + D_S - D_O$ |
| SASTEA | The subject ACTION begins concurrently with the object ACTION, but will extend beyond the object ACTION. | $S_O = S_S$ $D_S > D_O$ |
| SBEAST | The start of the object ACTION precedes that of the subject ACTION, but they will end concurrently. | $S_S = S_O + D_O - D_S$ $D_O > D_S$ |
| SDUREA | The subject ACTION is sequential but overlapping with the object ACTION. | $S_S > S_O$ $S_S > S_O + D_O - D_S$ $S_O > S_S - D_O$ |
| SDUREB | The subject ACTION starts after the start of object ACTION and ends before the end of object ACTION. | $S_S > S_O$ $S_O > S_S + D_S - D_O$ |
| STREND | The subject ACTION starts after the object ACTION ends. | $S_S > S_O + D_O$ |
| STRENE | The subject ACTION starts no earlier than the end of the object ACTION augmented by a fixed duration. | $S_S >= S_O + D_O + d$ |
| STRENL | The subject ACTION starts no later than the end of object ACTION augmented by a fixed duration. | $S_O >= S_S - D_O - d$ |
| STRSNE | The subject ACTION starts no earlier than the start of the object ACTION augmented by a fixed duration. | $S_S >= S_O + d$ |
| STRSNL | The subject ACTION starts no later than the start of object ACTION augmented by a fixed duration. | $S_O >= S_S - d$ |
| STRSTR | The subject ACTION starts after the object ACTION starts. | $S_S > S_O$ |

When the durations of actions are specified, the constraint specified on the end time of an action can be transformed to the start time of that action using the duration of that action. This is because the end time of an action is the start time of the action plus the duration of the action. Table 2 provides the transformed mathematical constraints specified using only the start times and the durations of the two actions. Specifically, $S_S$ and $S_O$ denote the start time of the subject and object actions respectively, while $D_S$ and $D_O$ denote the duration of the subject and object actions respectively. In addition, d denotes the "fixed duration", if specified, in the applicable association. Some of the associations have greater-than (">") or greater-than-or-equal-to (">=") type of constraints between the subject action and the object action, while others have less-than ("<") or less-than-or-equal-to ("<=") type of constraints between them. Mission Compiler 305 transforms all such constraints uniformly into a ">" or ">=" type of constraint to facilitate the reasoning of the temporal associations among groups of actions. For example, $S_S <= S_O + D_O + d$ is transformed to the equivalent inequality $S_O >= S_S - D_O - d$.

Mission representation 320 may specify durations for some actions. For actions with no specified duration, Mission Compiler 305 determines a duration. For example, Mission Compiler 305 may select the duration of the mission as a default duration. This approach assumes a worst case scenario, as the duration of most actions in a mission is shorter than the duration of the whole mission. As another example, Mission Compiler 305 may derive the duration constraints based on the temporal associations between actions. For example, if action A starts after action B finishes, and A finishes earlier than action C starts, then Mission Compiler 305 may estimate the duration of A as equal to C's earliest start time minus B's latest finish time.

Mission Compiler 305 uses the represented and derived mission information described above to create one or more formal models of the mission, such as Time Petri Nets, a graphical and mathematical modeling language suitable for modeling many systems or tasks (e.g., performance evaluation, multiprocessor memory systems, fault-tolerant systems, and/or communication protocols). A Petri Net is a directed bipartite graph, in which the nodes either represent transitions (i.e., events that may occur, signified by bars) or places (i.e., conditions, signified by circles). Directed arcs describe which places are pre- and/or post-conditions for which transitions (signified by arrows). The original definition of Petri Nets does not include the concept of time. However, for performance evaluation and scheduling problems of dynamic systems, it is useful to introduce timed delays in transitions and/or places as in Time Petri Nets (TPNs) and other time-based Petri net models. TPNs retain all aspects of a standard Petri net, and add temporal constraints to transitions, to places, to arcs, or to any combinations thereof.

The basic concept of Time Petri Nets (TPNs) is in accordance with the Merlin & Farber definition (P. M. Merlin, D. J. Farber, "Recoverability of Communication Protocols-Implications of a Theoretical Study", IEEE Transactions of Communications, 24(9):36-103, September 1976), in which temporal constraints are applied onto transitions only, and the formal definition of a TPN given by Berthomieu & Diaz, (B. Berthomieu, Michel Diaz, "Modeling and Verification of Time Dependent Systems Using Time Petri Nets", IEEE Transactions on Software Engineering, Vol 17, Number 3, March 1991) formally defining a TPN as a type: a Time Petri Net is a tuple (P, T, B, F, MO, SIM) where:

P is a finite nonempty set of places pi;

T is a finite nonempty, set of transitions t; it may be convenient to view it as an ordered set $\{t_1, t_2, \ldots, t_i\}$;

B is the backward incidence function, B: T×P+N, where N is the set of nonnegative integers;

F is the forward Incidence function, F: T×P+N;

MO is the Initial Marking function, MO: P+N (P, T, B, F and MO together define a Petri net); and SIM is a mapping called static interval, SIM: T→Q*× (Q*U ∞), where Q* is the set of positive rational numbers.

A time interval [a, b] (where a≤b) is associated with each transition t in a regular TPN. a (0≤a) is the minimal time that must elapse, starting from the time at which transition t is enabled, to the time transition t can fire. b (0≤b≤∞) denotes the maximum time during which transition t can be enabled without being fired. A transition t with no explicit specification of time interval may be implicitly associated with a default interval [0, ∞].

Creating a TPN Model of a mission presents a number of challenges, such as how to represent an action of a mission in TPN notions and how to model the temporal associations among actions in a TPN model. The methods described herein first construct the TPN model for each action as atomic elements, and then construct the TPN model for temporal associations among the actions using the actions' TPN models created in the first step. Finally, functional associations are added as properties of the respective actions' TPN models.

Figure 6:
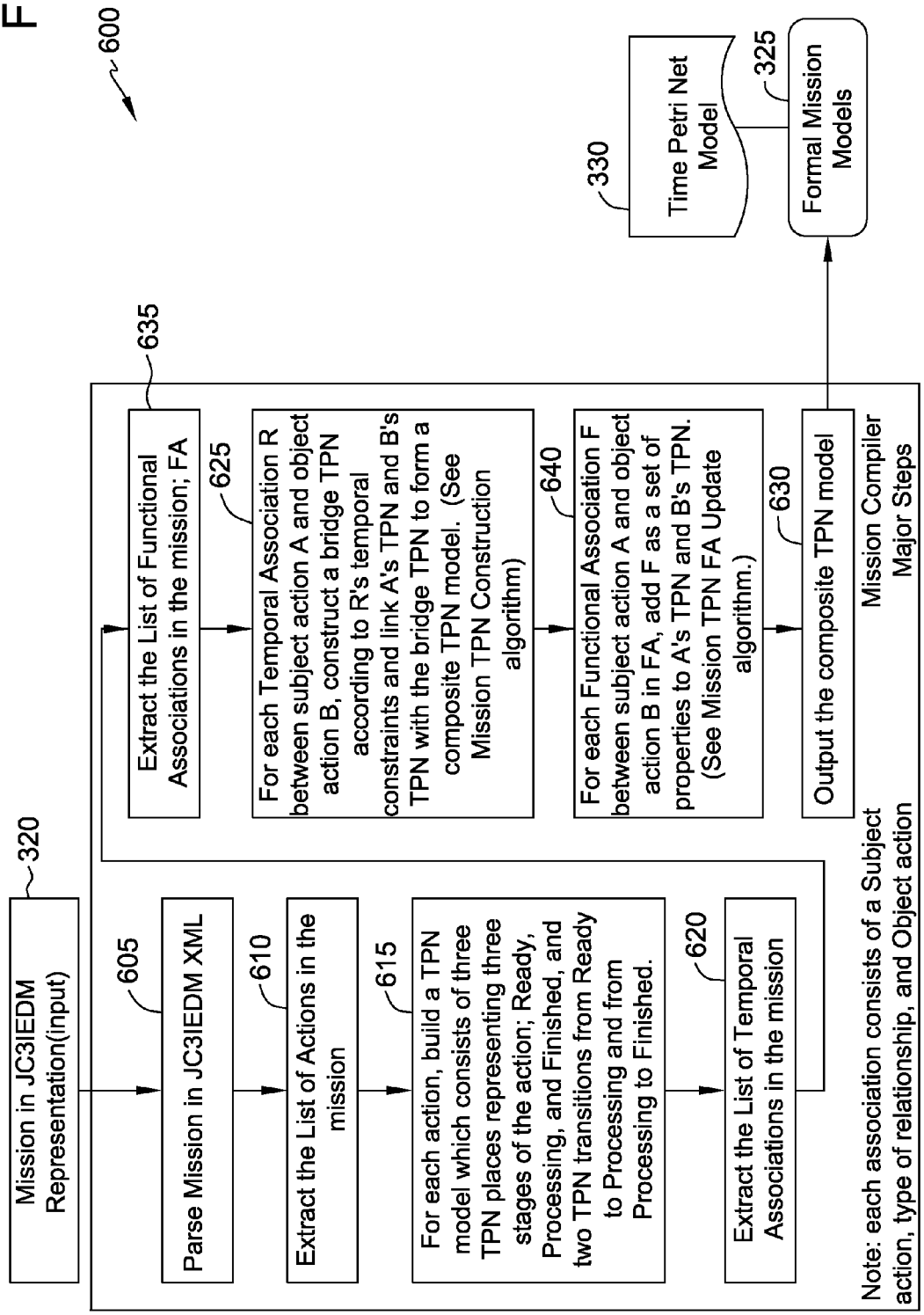
FIG. 6 is a flowchart of an exemplary method for creating formal models based on a mission representation.

FIG. 6 is a flowchart of an exemplary method 600 for creating formal models 325 based on a mission representation 320 (both shown in FIG. 3). In exemplary embodiments, method 600 is performed by Mission Compiler 305 (shown in FIG. 3), which is executed by a computing device 100 (shown in FIG. 1).

Mission Compiler 305 parses 605 mission representation 320 and extracts 610 the actions in the mission from mission representation 320 (e.g., in JC3IEDM format). For each action A, Mission Compiler 305 creates 615 a TPN model of the action including three states and two transitions.

Figure 7:
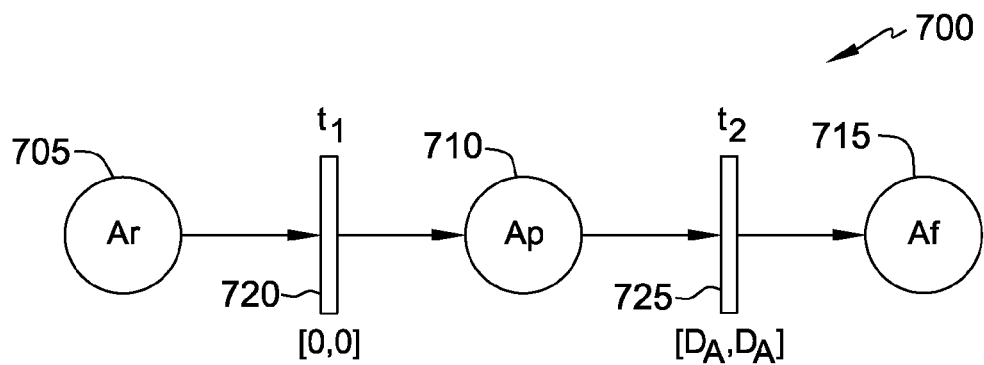
FIG. 7 is an illustration of a TPN model for an action.

FIG. 7 is an illustration of a TPN model 700 for an action. TPN model 700 includes a ready state 705, a processing state 710, and a finished state 715, denoted $A_r$, $A_p$, and $A_f$, respectively. TPN model also includes a first transition 720 from ready state 705 to processing state 710 a second transition 725 from processing state 710 to finished state 725, denoted $t_1$ and $t_2$, respectively. Firing of the transition $t_1$ turns a "ready" stage into "processing", and firing of the transition $t_2$ turns a "processing" stage into "finished". In addition, for the duration of action A specified as $D_A$, Mission Compiler 305 associates a time interval $[D_A, D_A]$ with transition $t_2$. Similarly, Mission Compiler 305 associates a time interval [0, 0] with the transition $t_1$ by default. Initially, a token is assigned to $A_r$. Conceptually and from a computing point of view, the TPN model for each action represents an action when given resources to execute will have a start time specified by transition $t_1$ (at 0 by default), have an execution time between a time interval specified by transition $t_2$ (at $[D_A, D_A]$ when duration is specified as $D_A$), and finish at a time as the addition of the start time by transition $t_1$ and the execution time by transition $t_2$. This approach allows flexibility of supporting timing specifications of actions and their temporal associations in a mission.

Some mission representation formats (e.g., JC3IEDM) allow an optional specification of the duration and/or start time and end time for actions. It is assumed herein that the duration is defined for each action and is not subject to fluctuation. Therefore, an action A whose duration is $D_A$ has the time interval $[D_A, D_A]$ for the transition $t_2$ in the TPN. This assumption does not constrain the general applicability of the methods described herein because an estimate could be provided if the duration is not specified, and a fluctuating duration can be represented by a min and a max with a time interval [min, max].

Mission Compiler 305 extracts 620 temporal associations among the actions in the mission from the mission representation (e.g., in JC3IEDM). For each temporal association R between actions A and B, Mission Compiler 305 uses the TPN models of A and B constructed 615 previously, identifies a temporal association R between A and B (e.g., as listed in Table 1), and creates 625 a "bridge" TPN representing R that links the TPN models of A and B and forms a single combined TPN model.

Figure 8:
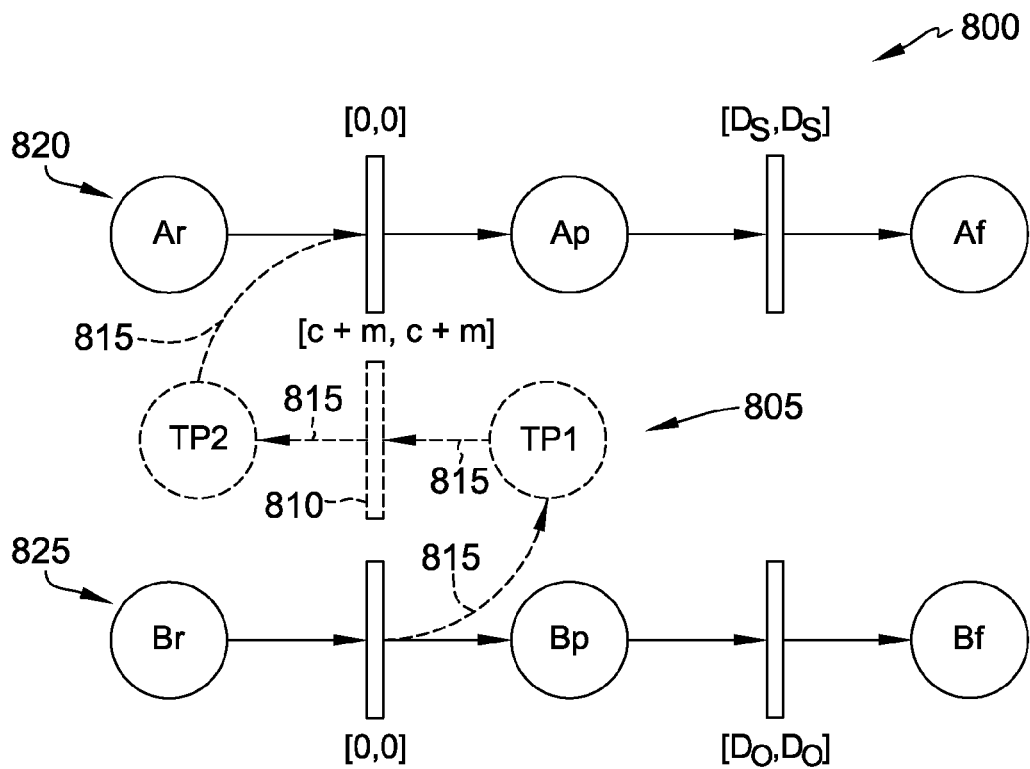
FIG. 8 is an illustration of an exemplary TPN model including a bridge TPN.

FIG. 8 is an illustration of an exemplary TPN model 800 including a bridge TPN 805. Bridge TPN 805, indicated by dashed lines in FIG. 8, includes two places (TP1 and TP2), one transition 810 (with time interval [c+m, c+m]), and four arcs 815. Bridge TPN 805 connects a first TPN model 820 of a first action A and a second TPN model 825 of a second action B such that the temporal association between A and B specified in the mission representation holds true. Note, by the design of the derived constraints in Table 2, the inequality constraint of any association can be generalized as $S_A >= S_B + c$ or $S_B >= S_A + c$, where $S_A$ and $S_B$ are the start time of A and B, respectively, and c is an integer. (In the case of an inequality constraint of greater-than (">"), as opposed to greater-than-or-equal-to (">="), the equation $S_A > S_B + c$ or $S_B > S_A + c$ may be used.) For purposes of illustration, the example of $S_A >= S_B + c$ is further elaborated below.

The inequality of $S_A >= S_B + c$ can be transformed into an equation $S_A = S_B + c + m$, where m is a nonnegative integer for an inequality of ">=" and a positive integer for an inequality of ">". As such, the time interval of transition 810 of bridge TPN 805 is defined as [c+m, c+m]. Conceptually, this time interval [c+m, c+m] is a delay for $S_A$ relative to $S_B$. m=0 for an inequality of ">=" and m=1 for an inequality of ">", respectively, are the smallest delays that satisfy the inequality constraint of any association between A and B. Further, if the inequality constraint were $S_B > S_A + c$, arcs 815 would be reversed from A to B (i.e., the arcs of bridge TPN 805 point to the action with a later start time S).

Figure 9:
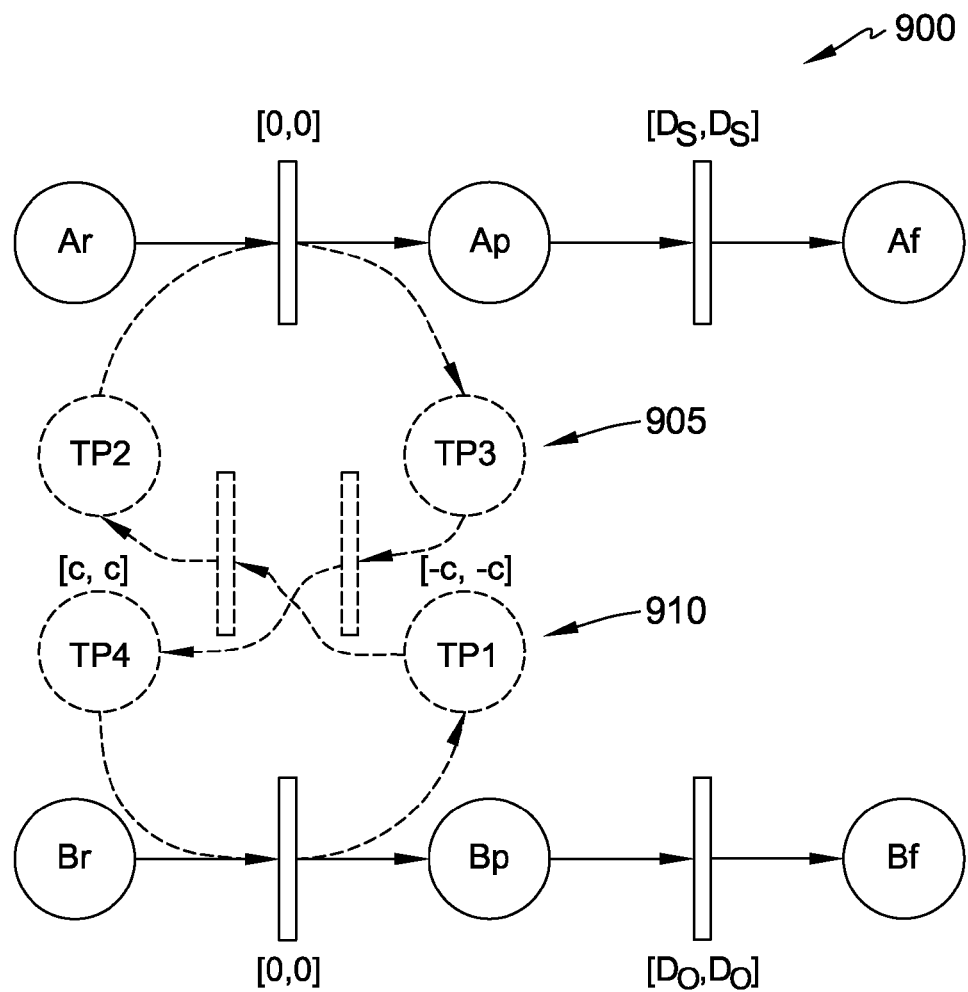
FIG. 9 is an illustration of an exemplary TPN model with a "circular bridge pair" formed by a first TPN bridge and a second TPN bridge.

A constraint in the form of equation $S_A = S_B + c$ is equivalent to the combination of two inequalities: $S_A >= S_B + c$ & $S_B >= S_A - c$. That is, $S_A = S_B + c$ & $S_B = S_A - c$. As a result, during TPN construction, Mission Compiler 305 may replace each equation with such two inequalities and thus two TPN bridges. FIG. 9 is an illustration of an exemplary TPN model 900 with a "circular bridge pair" formed by a first TPN bridge 905 and a second TPN bridge 910. This special circular bridge pair is symmetric and harmless (since the value remains the same regardless how many times the bridge pair is traversed). Accordingly, and unlike other types of circular dependencies, Mission Compiler 305 can handle circular bridge pairs with no problem in the analysis of the model. For the execution of the model in traditional TPN tools, Mission Compiler 305 removes all the bridges after the start times of the actions are derived and attaches the start times to each individual action's TPN.

As shown in Listing 1, the exemplary search and rescue mission includes the following actions:

MonitorScene (MS): has an estimated time duration of 80 time units and a STREND temporal association with action DetermineEnemyLocation (DL)

DetermineEnemyLocation (DL): has an estimated time duration of 40 time units.

The STREND temporal association dictates that MS starts after DL ends.

Figure 10:
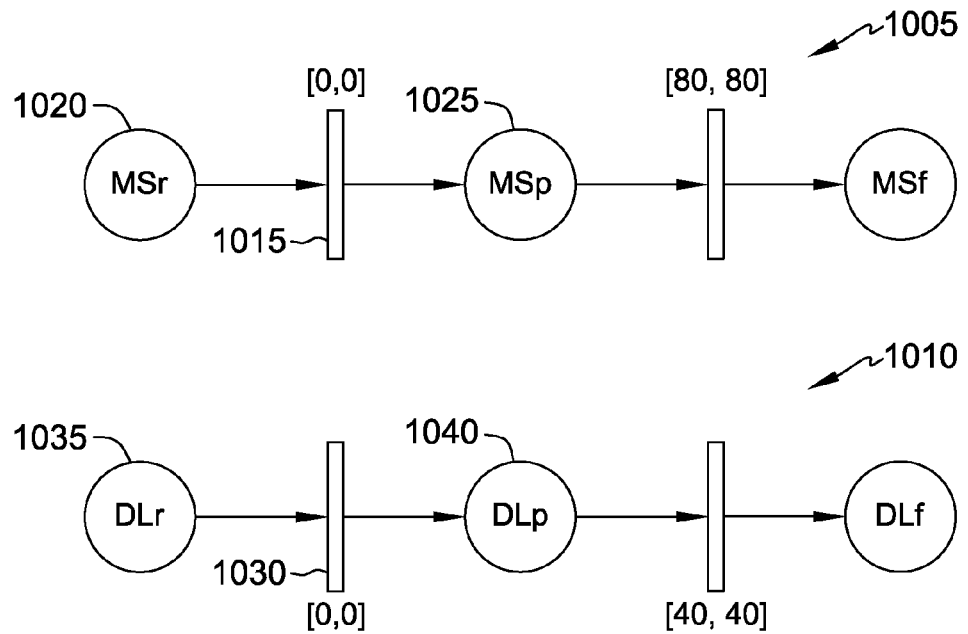
FIG. 10 is an illustration of TPN models created for the MS and DL actions shown in FIG. 4.

FIG. 10 is an illustration of TPN models created 615 for the MS and DL actions. A first TPN model 1005 represents the MS action, and a second TPN model 1010 represents the DL action. As described above, first TPN model 1005 includes a transition 1015 between a ready place 1020 and a processing place 1025. Similarly, second TPN model 1010 includes a transition 1030 between a ready place 1035 and a processing place 1040.

Figure 11:
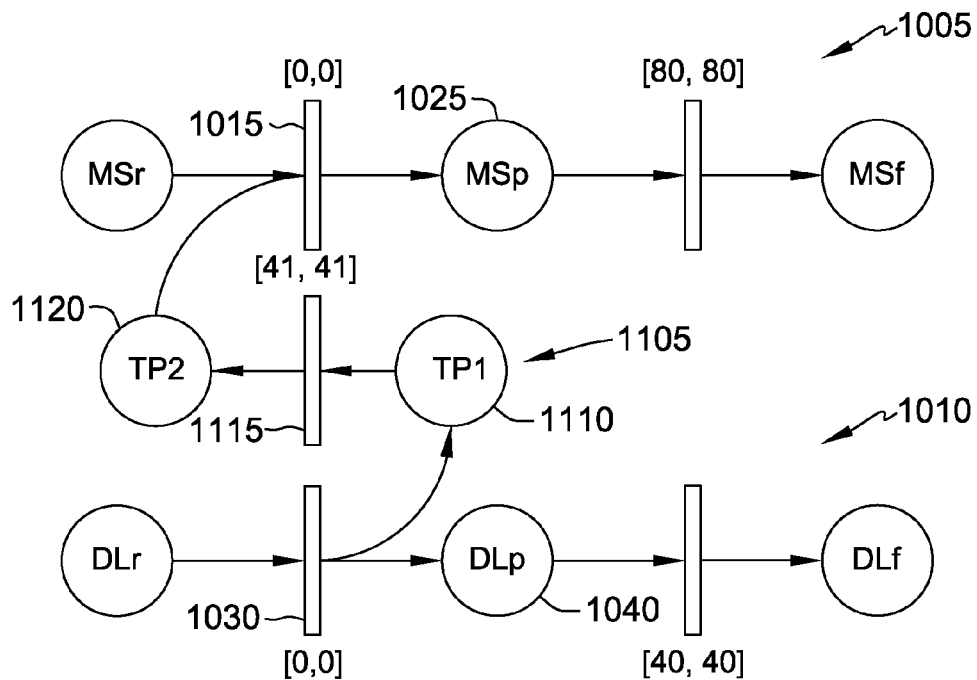
FIG. 11 is an illustration of a bridge TPN created to connect a first TPN model and a second TPN model based on the STREND temporal association between the MS and DL actions shown in FIG. 4.

FIG. 11 is an illustration of a bridge TPN 1105 created 625 to connect first TPN model 1005 and second TPN model 1010 based on the STREND temporal association between the MS and DL actions. Bridge TPN 1105 includes a first place 1110 extending from transition 1030 of second TPN model 1010. A transition 1115 is positioned between first place 1110 and a second place 1120 of bridge TPN 1105. Second place 1120, in turn, is connected to transition 1015 of first TPN model 1005. Accordingly, bridge TPN 1105 indicates that triggering of transition 1030 in second TPN model 1010 results in the MS action advancing to processing place 1025, in addition to the DL action advancing to processing place 1040.

As bridge TPNs are created 625 for each temporal association R, a composite TPN model is gradually built from the individual TPN models representing multiple actions according to the associations among these actions using the bridge TPN construct. Notably, each bridge TPN includes its own miniature TPN model, and that the bridge TPNs do not share components such as places, transitions, or arcs with other bridge TPNs.

Figure 12:
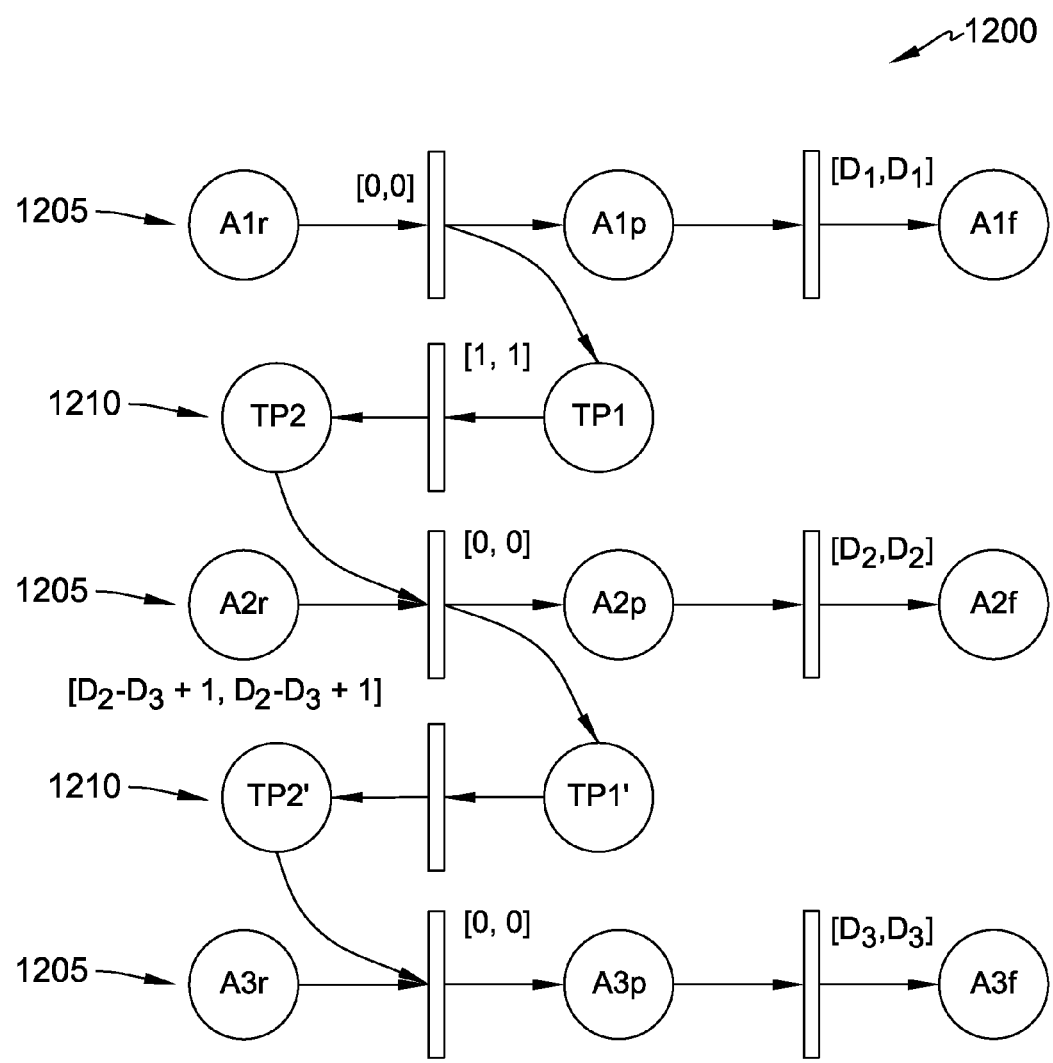
FIG. 12 is an illustration of a composite TPN model including TPN models representing three actions and bridge TPNs representing temporal associations between the actions.

FIG. 12 is an illustration of a composite TPN model 1200 including TPN models 1205 representing three actions ($A_1$, $A_2$, and $A_3$) and bridge TPNs 1210 representing temporal associations between the actions. As indicated by composite TPN model 1200, the following temporal associations are defined by the mission representation:

$A_2$ starts after $A_1$ starts (a STRSTR association): $S_{A2} > S_{A1}$; and $A_3$ ends after $A_2$ ends (an ENDEND association): $S_{A3} > S_{A2} + D_2 - D_3$.

In exemplary embodiments, a TPN model of a mission represented by a mission representation M is created using Mission TPN Construction Algorithm as follows:

1. For each action A, in the mission, Mission Compiler 305 creates 615 a TPN $T_i$ (e.g., as shown in FIG. 7) and assigns a set of properties to $T_i$ as follows:

1.a. $I_i$: Number of incoming arcs to transition $t_{i1}$, initialized to 0. Note that arcs extending to $t_{i1}$ from the circular bridge pairs introduced by equation constraints are not counted in $I_i$.

1.b. $O_i$: Number of outgoing arcs from $t_{i1}$, initialized to 0. Note that arcs extending into the circular bridge pairs introduced by equation constraints are not counted in $O_i$.

1.c. $L_i$: Lower bound on the start time of action $A_i$, to be initialized and updated at analysis time, as described below with reference to the Urgency Analysis algorithm.

1.d. $U_i$: Upper bound on the start time of action $A_i$, to be initialized and updated at analysis time, as described below with reference to the Urgency Analysis.

1.e. $V_i$: a temporary variable to record the number of incoming and/or outgoing arcs yet to be visited at analysis time, as described below with reference to the Urgency Analysis.

2. For each temporal association R of each action $A_i$, Mission Compiler 305 performs the following operations:

2.a. Determine derived constraints C of the temporal association, such as by selecting C from a lookup table, such as Table 2, based on an identifier (e.g., abbreviation) of the temporal association in the mission representation M.

2.b. For each constraint formula F in C that is not defined purely on the durations (e.g., $D_S$ and $D_O$ in Table 2), do:

2.b.i. If F is an equation (e.g., R has type SAEAST, SASTEA, or SBEAST) as $S_i = S_k + d$ (where $S_i$ and $S_k$ are the start times of the two associated actions, and d is a constant), Mission Compiler 305 creates 625 a bridge from $T_k$ and $T_i$ with the label (e.g., time interval) [d, d] in the bridge transition, and another bridge from $T_i$ to $T_k$ with the label [−d,−d] in the bridge transition (where $T_i$ is the TPN for $A_i$, and $T_k$ is the TPN for $A_k$.). For example, Mission Compiler 305 may create 625 the two bridges as illustrated in FIG. 9.

2.b.ii. If F is not an equation as described above, if the formula is a greater-than formula as $S_i > S_k + d$, Mission Compiler 305 assigns m=1; otherwise the formula is a greater-than-or-equal-to formula as $S_i >= S_k + d$, and Mission Compiler 305 assigns m=0. Mission Compiler 305 creates 625 a bridge from $T_k$ to $T_i$ with the label [d+m, d+m] in the bridge transition (e.g., as illustrated in FIG. 8). Mission Compiler 305 also increases $I_k$ and $O_i$ by 1.

Mission Compiler 305 outputs 630 one or more formal mission models 325, such as the composite TPN model 330 of inter-related TPN models representing mission actions. Composite TPN model 330 includes temporal constraints derived from the temporal associations, as described above.

In exemplary embodiments, Mission Compiler 305 also takes into account functional associations between actions when creating formal mission models 325. JC3IEDM specifies a total of eleven functional associations for actions, as shown in Table 3 below. Each association is a constraint expressed in the form of <Subject, R, Object>. To facilitate QoS importance analysis, the implications of the associations are formalized into formulae, examples of which are included in Table 3.

TABLE 3

| Functional Association Abbreviation | Description | Importance Value Assignment Formula |
|---|---|---|
| ALT | The subject ACTION may replace the object ACTION. | $i(s) = i(o)$ |
| HASPRV | The subject ACTION may be re-directed to an alternative object ACTION. Note: The need for object ACTION is foreseen in planning, but its execution depends on external circumstances. | $i(s) = i(o)$ |
| HASSEC | The subject ACTION is designated as the primary activity and has the object ACTION as a secondary activity. | $i(s) = w * i(o)$ |
| HSA | The subject ACTION has the object ACTION as a sub-ACTION. | $i(s) = f(i(o))$ |
| IMO | The subject ACTION amends (or suggests an amendment to) an existing object ACTION (be it a plan, order, or request). | $i(s) = i(o)$ |
| INRSTO | The subject ACTION is planned to be or may be expected to be carried out in reaction to the object ACTION. | $i(s) = i(o)$ |
| IOT | The subject ACTION is to be carried out so that the conditions are established for the completion of the object ACTION (Note: This has no bearing on the temporal associations between ACTIONs). | $i(s) = w* i(o)$ |
| ISAPRQ | The subject ACTION must be completed as planned before the object ACTION may commence, i.e., the subject ACTION is a prerequisite for the object ACTION. | $i(s) = w * i(o)$ |
| ISCAUS | The subject ACTION is the cause for the object ACTION. | $i(s) = w * i(o)$ |
| TPL | The subject ACTION constitutes an example that the object ACTION should conform to, i.e., the subject ACTION is a template for the object ACTION. | $i(s) = i(o)$ |
| UAR | The subject ACTION uses the object ACTION as a reference. | $i(s) = i(o)$ |

Figure 13:
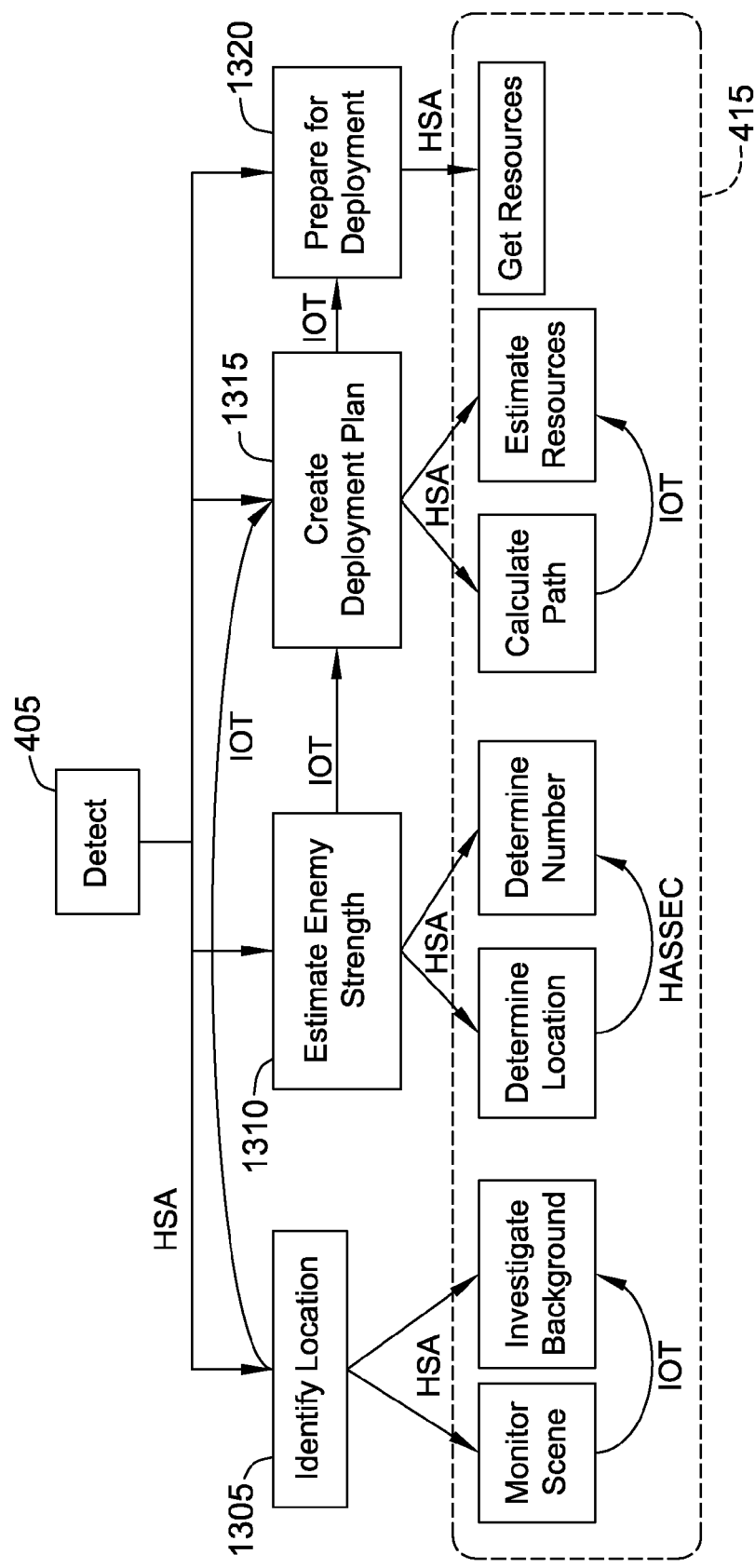
FIG. 13 is an illustration of the detect phase shown in FIG. 4 with functional associations indicated.

Among the functional associations described in Table 3, HSA (has sub-action) can be viewed as a special functional association that introduces hierarchies among actions. If a subject action SA has HSA associations with object actions, $OA_1, OA_2, \ldots,$ and $OA_n$, i.e., if $HSA(SA, OA_1), HSA(SA, OA_2), \ldots,$ and $HSA(SA, OA_n)$, then SA may be referred to as the parent of such object actions $OA_1, OA_2, \ldots,$ and $OA_n$. FIG. 13 is an illustration of detect phase 405 (described above with reference to FIG. 4) of the exemplary search and rescue scenario with functional associations indicated. As defined in the mission representation (a potion of which is provided in Listing 1), detect phase 405 has an HSA functional association to an identify location action 1305, an estimate enemy strength action 1310, a create deployment plan action 1315, and a prepare for deployment action 1320. These four sub-actions of detect phase 405 also have their sub-actions 415 specified by HSA functional association. Both identify location action 1305 and estimate enemy strength action 1310 have an IOT functional association to create deployment plan action 1315, which has an IOT functional association to prepare for deployment action 1320. FIG. 13 also illustrates functional associations between the sub-actions 415 of identify location action 1305, estimate enemy strength action 1310, create deployment plan action 1315, and prepare for deployment action 1320.

As described in the Mission TPN Construction algorithm above, each action A in the mission has a TPN T, and a few properties are associated with each TPN T. Functional associations may be represented by additional properties of the TPNs. Each functional association includes three parts: the association type (e.g., IOT or HSA), the subject action and the object action. The "Functional Association Abbreviation" column in Table 3 specifies the eleven types of functional associations in JC3IEDM.

Referring to FIG. 6, in exemplary embodiments, Mission Compiler 305 extracts 635 functional associations from mission representation 320 and, for each functional association, adds 640 properties to the TPN models corresponding to the associated actions. The following is an exemplary algorithm for updating the TPN models created by Mission Compiler 305 by adding the additional properties to each TPN. To facilitate efficient analysis (see the Importance Analysis algorithm later), the HSA functional association may be treated separately from other ten types of functional association. Specifically, the HSA functional association creates a parent-child association between the specified subject and object actions. Note that each action can have at most a single parent action defined by an HSA functional association in JC3IEDM.

For each TPN T of a given action, Mission Compiler 305 collects three properties: P, C and F. P is the TPNs of T's parent action, if any exists. The C is the set of all TPNs of T's child actions. F is the set of all non-HAS functional associations whose subject action is T, where each functional association is triple in the form of <Subject, Functional association R, Object>.

In exemplary embodiments, Mission Compiler 305 updates the TPNs to include functional association information according to the following algorithm, which takes as input the composite TPN model created as described above and the corresponding JC3IEDM mission representation M with the set of functional associations, S, between actions in the mission.

1. For each action $A_i$'s TPN $T_i$, assign an additional set of properties to Ti as follows:
   1.a. $P_i$: the $A_k$'s TPN $T_k$ such that there is a $HSA(A_k, A_i)$ in S, to be assigned in step 2 below.
   1.b. $C_i$: the set of TPNs including any and only $A_k$'s TPN $T_k$ such that there is a $HSA(A_j, A_k)$ in S, initialized to the empty set { } and to be updated in step 2 below.
   1.c. $F_i$: the set of non-HSA functional associations with A, as the subject action, initialized to the empty set { } and to be updated in step 2 below.
   1.d. $X_i$: the importance value derived from child actions using the HSA (hierarchical) functional association, to be used in the Importance Analysis Algorithm.
   1.e. $Y_i$ as the importance value derived using other (non-HSA) functional associations, to be used in the Importance Analysis Algorithm.

2. For each functional association $<A_i, R, A_k>$:
   2.a. Let $T_i$ be the TPN for $A_i$, and $T_k$ be the TPN for $A_k$.
   2.b. If the functional association type R is a HSA, add $T_k$ to $C_i$, and assign $T_i$ to $P_k$.
   2.c. Otherwise, add the triple $<A_i, R, A_k>$ to $R_j$.

Accordingly, Mission Compiler 305 outputs 630 a TPN model 330 of the mission M that includes the functional associations. Mission Compiler 305 may also output 630 as a formal mission model 325.

Mission QoS Reasoner Service

Referring to FIG. 3, Mission QoS Reasoner 310 analyzes formal mission models 325 from Mission Compiler 305, including functional and temporal constraints, and generates QoS policies with appropriate (e.g., optimal) importance and urgency values for executions of the actions.

Figure 14:
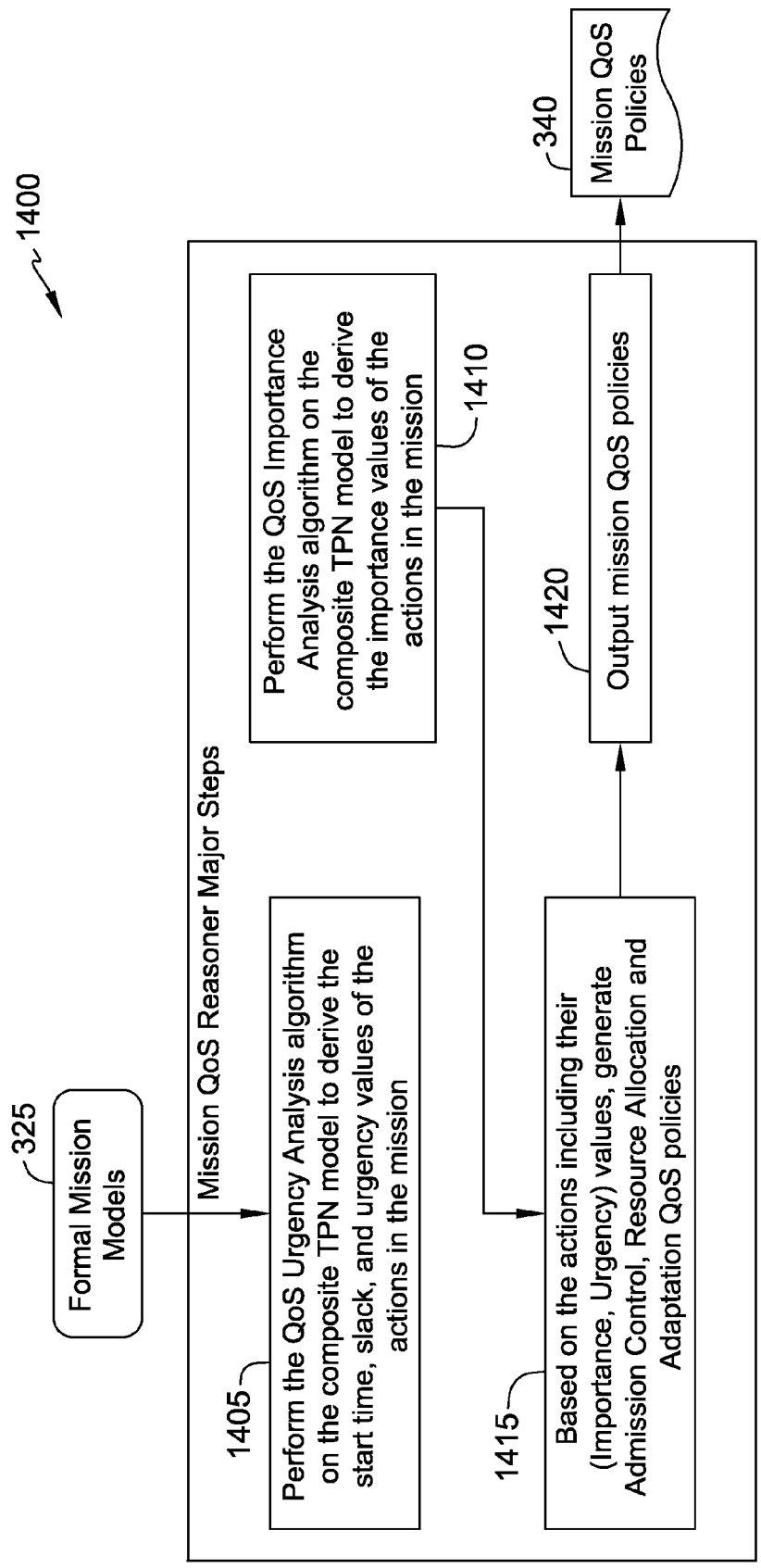
FIG. 14 is a flowchart of an exemplary method for creating mission QoS policies based on formal mission models.

FIG. 14 is a flowchart of an exemplary method 1400 for creating mission QoS policies 340 based on formal mission models 325 (both shown in FIG. 3). In exemplary embodiments, method 1400 is performed by Mission QoS Reasoner 310 (shown if FIG. 3), which is executed by a computing device 100 (shown in FIG. 1).

Mission QoS Reasoner 310 performs 1405 a QoS Urgency Analysis algorithm on composite TPN model 330 (shown in FIG. 3), which is included in formal mission models 325 produced by Mission Compiler 305. By performing 1405 the QoS Urgency Analysis algorithm, Mission QoS Reasoner 310 derives the start time, slack, and/or urgency values of actions in composite TPN model 330.

With composite TPN model 330 constructed from the mission representation 320, Mission QoS Reasoner 310 employs one or more analysis techniques to derive urgency values for the executions of the actions in the mission. Two techniques described here are based on the temporal constraints in TPN model 330. One is the analysis of relative start time of the actions. As described in the TPN model construction process, the "bridge" TPN constructs constrain the start times of the actions; some must start after others and thus have less urgency given to resources to execute. Second is the analysis of a critical path and determining slack times for each action, and then using slack time values to assign urgency values. The slack time is defined as the difference between the earliest and latest possible start time of each task, without prolonging execution of the overall mission. That is, even if an action could start to execute at time t, delaying the start by the amount of slack time would not affect the overall mission execution time. In exemplary embodiments, the slack time is negatively correlated with the urgency values; the longer the slack time, the less urgent the action is.

An exemplary QoS Urgency Analysis algorithm to derive the optimal start time and slack time is described below. The algorithm operates on TPN model 330 as input and derives the lower bound and upper bound of start time as output. The optimal start time is the lower bound and the slack is the difference between the upper bound and the lower bound. As noted with reference to the exemplary Mission TPN Construction algorithm described above, each action's TPN $T_i$ has five properties:

$I_i$: Number of incoming arcs to $t_{i1}$ except those arcs introduced due to equation constraints.

$O_i$: Number of outgoing arcs from $t_{i1}$ except those arcs introduced due to equation constraints.

$L_i$: Lower bound on the start time of action $A_i$.

$U_i$: Upper bound on the start time of action $A_i$.

$V_i$: A temporary variable to record the number of incoming or outgoing arcs yet to be visited at runtime.

Applying the exemplary QoS Urgency Analysis algorithm, Mission QoS Reasoner 310 derives optimal start time and slack time as follows:

1. For each action's TPN $T_i$: initialize $V_i = I_i$; $L_i = U_i = 0$.

2. Let Q be the queue of all $T_i$ whose associated $I_i = 0$. ($I_i = 0$ means $T_i$ is a source with no incoming arcs).

3. While Q is not empty, do:

3.a. Dequeue $T_i$ from Q.

3.b. For each $T_k$ such that $T_i$ has a "bridge" going to $T_k$, with the transition label [d+m, d+m], do:

3.b.i. If $L_k < L_i + d + m$, assign $L_i + d + m$ to $L_k$.

3.b.ii. Let S be a set including only $T_k$ (S is used to remember all visited actions' TPNs that are related to $T_k$ through equation constraints, to avoid revisiting the same action TPN again).

3.b.iii. Let $Q_L$ be a queue with $T_k$ as the only element.

3.b.iv. While $Q_L$ is not empty, do:

3.b.iv.1. Dequeue $T_A$ from $Q_L$.

3.b.iv.2. For each TPN $T_B$ not in S and where a circular bridge pair exists between $T_A$ and $T_B$ with transition label [$d_1$, $d_1$] from $T_A$ to $T_B$, do:

3.b.iv.2.a. If $L_B < L_A + d_1$, assign $L_A + d_1$ to $L_B$, and add $T_B$ to $Q_L$.

3.b.iv.2.b Add $T_B$ to S.

3.b.v. Decrease $V_k$ by 1.

3.b.vi. If $V_k = 0$, add $T_k$ to Q.

4. Let $M = \max(L_1, L_2, \ldots, L_n)$, where M is the length of the critical path of the mission.

5. For each action's TPN initialize $V_i = O_i$.

6. Let Q be the queue of all $T_i$ whose associated $O_i = 0$; set $U_i = M$. ($O_i = 0$ means that $T_i$ is a sink with no outgoing arcs.)

7. While Q is not empty, do:

7.a. Dequeue $T_i$ from Q.

7.b. For each $T_k$ with a bridge going to $T_i$ with the transition label [d+m, d+m], do:

7.b.i. If $U_k > U_i - (d+m)$, assign $U_i - (d+m)$ to $U_k$.

7.b.ii. Let S be a set including only $T_k$ (S is used to remember all visited actions' TPNs that are related to $T_k$ through equation constraints, to avoid revisiting the same action TPN again).

7.b.iii. Let $Q_L$ be a queue including only $T_k$.

7.b.iv While $Q_L$ is not empty, do:

7.b.iv.1. Dequeue $T_A$ from $Q_L$.

7.b.iv.2. For each TPN $T_B$ not in S and there is a circular bridge pair between $T_A$ and $T_B$ with transition label [$d_1$, $d_1$] from $T_A$ to $T_B$, do:

7.b.iv.2.a. If $U_B > U_A + d_1$, assign $U_A + d_1$ to $U_B$ and add $T_B$ to $Q_L$.

7.b.iv.2.b. Add $T_B$ to S.

7.b.v. Decrease $V_k$ by 1.

7.b.vi. If $V_k = 0$, add $T_k$ to Q.

Executing the operations above, Mission QoS Reasoner 310 outputs $L_i$ and $U_i$ for each action $A_i$. For each action $A_i$ with $T_i$, the optimal relative start time is $L_i$ and its slack time is $U_i - L_i$.

Mission QoS Reasoner 310 also assigns an urgency value to each action A, based on the start time $L_i$ and/or slack time $U_i - L_i$. In exemplary embodiments, Mission QoS Reasoner 310 sorts the n actions by start time to create an ordered list. Assuming a scale of 1-10, with 1 being the lowest urgency value, and 10 being the highest urgency value, QoS Reasoner 310 assigns an urgency value factor v to each of the actions according to its ranking in the ordered list, normalized to the scale 1-10.

In one exemplary embodiment, Mission QoS Reasoner 310 assigns another urgency value factor u to each of the actions according to its slack value: $u = 1 + 9*(\text{max\_slack} - \text{slack})/\text{max\_slack}$, where max_slack is the largest slack time of all actions. The formula reflects the insights that the slack time and the urgency value of the actions are negatively correlated. It also normalizes the urgency value to be between 1 and 10.

In another exemplary embodiment, Mission QoS Reasoner 310 assigns the urgency value factor u to each of the actions using a ladder function as in Table 4.

TABLE 4

| Condition | Value of u |
| --- | --- |
| 0 ≤ slack < 0.1 * max_slack | 10 |
| 0.1 * max_slack ≤ slack < 0.2 * max_slack | 9 |
| 0.2 * max_slack ≤ slack < 0.3 * max_slack | 8 |
| 0.3 * max_slack ≤ slack < 0.4 * max_slack | 7 |
| 0.4 * max_slack ≤ slack < 0.5 * max_slack | 6 |
| 0.5 * max_slack ≤ slack < 0.6 * max_slack | 5 |
| 0.6 * max_slack ≤ slack < 0.7 * max_slack | 4 |
| 0.7 * max_slack ≤ slack < 0.8 * max_slack | 3 |
| 0.8 * max_slack ≤ slack < 0.9 * max_slack | 2 |
| 0.9 * max_slack ≤ slack < max_slack | 1 |

The two factors v and u are combined to derive the urgency parameter required to constrain the resource allocations to an action. As an example, the urgency value of an action can be calculated as v*u/100, where v and u are both between 1 and 10.

Mission QoS Reasoner 310 also performs 1410 an Importance Analysis algorithm to derive importance values of actions in the mission based on composite TPN model 330. Functional associations among tasks in a mission often imply the relative importance of these tasks. Table 3 above shows example constraints on the relative importance of two tasks according to each functional association between them. For example, given IOT(SA, OA), i.e., the subject action SA is to be carried out to establish the conditions for the completion of the object action OA, Mission QoS Reasoner 310 in exemplary embodiments infers that SA should be considered more important than SO, since without SA, SO would not be carried out. Three other functional associations, namely, HASSEC, ISAPRQ, and ISCAUS, are similar to IOT. In these three functional associations, Mission QoS Reasoner 310 in exemplary embodiments also considers SA to be more important than OA, according to their association descriptions. For other non-HSA functional associations, Mission QoS Reasoner 310 in exemplary embodiments assigns the two actions the same level of importance.

In an exemplary embodiment, Mission QoS Reasoner 310 uses the formula shown in Equation 1 below to assign importance values of SA and OA.

$$imp(SA) = w * imp(OA) \quad \text{(Eq. 1)}$$

In Equation 1, w represents a weight. w=1 if the functional association does not imply any difference in importance, and w>1 if the functional association hints that SA should be treated more importantly than OA.

As described above with reference to Mission Compiler 305, the HSA functional association, which introduces a hierarchical structure on actions, can be viewed as a special functional association. Assume multiple HSA associations exist for the same subject action (SA) with a set of different object actions ($OA_1, OA_2, \ldots OA_n$), i.e., HSA(SA, $OA_1$), HSA(SA, $OA_2$), . . . , HSA(SA, $OA_n$), then the importance value of SA may be defined by aggregating the importance values of the child actions $OA_1, OA_2, \ldots, OA_n$. In an exemplary embodiment, Mission QoS Reasoner 310 aggregates the importance values of the child actions using an averaging function as shown in Equation 2.

$$imp(SA) = average(imp(OA_1), imp(OA_2) \ldots imp(OA_n)) \quad \text{(Eq. 2)}$$

In exemplary embodiments, Mission QoS Reasoner 310 uses a bottom-up approach to derive the importance value for all actions in a mission using the TPN model 330 augmented with functional association hierarchy 335 created by Mission Compiler 305. Note that each action only has at most a single parent action in JC3IEDM. For clarity, it is assumed that the non-HSA functional association only exists among actions sharing the same parent action (i.e., among the siblings). This assumption is generally true in missions represented in JC3IEDM. However, this is not a limitation of the algorithm described; rather, a minor extension to the algorithm can be made to deal with cases where such an assumption does not hold. For example, non-HSA functional associations between leaf actions that are not siblings, if they exist, can be processed as an initial step so that for each such an association $<A_S, R, A_O>$, the initial importance value of the subject action $A_s$ is calculated from the importance value of the object action $A_o$ based on the constraints of relationship R in Table 3. By default, a leaf action's initial importance value is 1.

Conceptually, the QoS Importance Analysis algorithm leverages the fact that there is one top-down hierarchical functional association "HSA" (parent-children relationship) and the remaining functional associations are horizontal functional association (sibling-sibling relationship). In a hierarchical "HSA" parent-children relationship, the parent's importance value is calculated based on the children's importance values. In a horizontal, subject-sibling-to-object-sibling relationship, the subject sibling's importance value is a function of the object sibling's importance value. The QoS Importance Analysis algorithm then works from each parent-children branch in a bottom up approach by first resolving the sibling-sibling constraints among the siblings and then calculating the parent's importance value. Because a parent's importance value could change due to the next level sibling-sibling constraints among the parent siblings, the algorithm propagates down the change proportionally to the children of a parent. Through the iterative updates, the algorithm will eventually terminate.

An exemplary QoS Importance Analysis algorithm is described formally in detail below. Note that the algorithm maintains two importance values for each action $A_i$:$X_i$ as the importance value derived from child actions using the HSA (hierarchical) functional association and $Y_i$ as the importance value derived using other non-HSA (horizontal) functional associations. These two values are eventually reconciled for each action by the algorithm.

Figure 15:
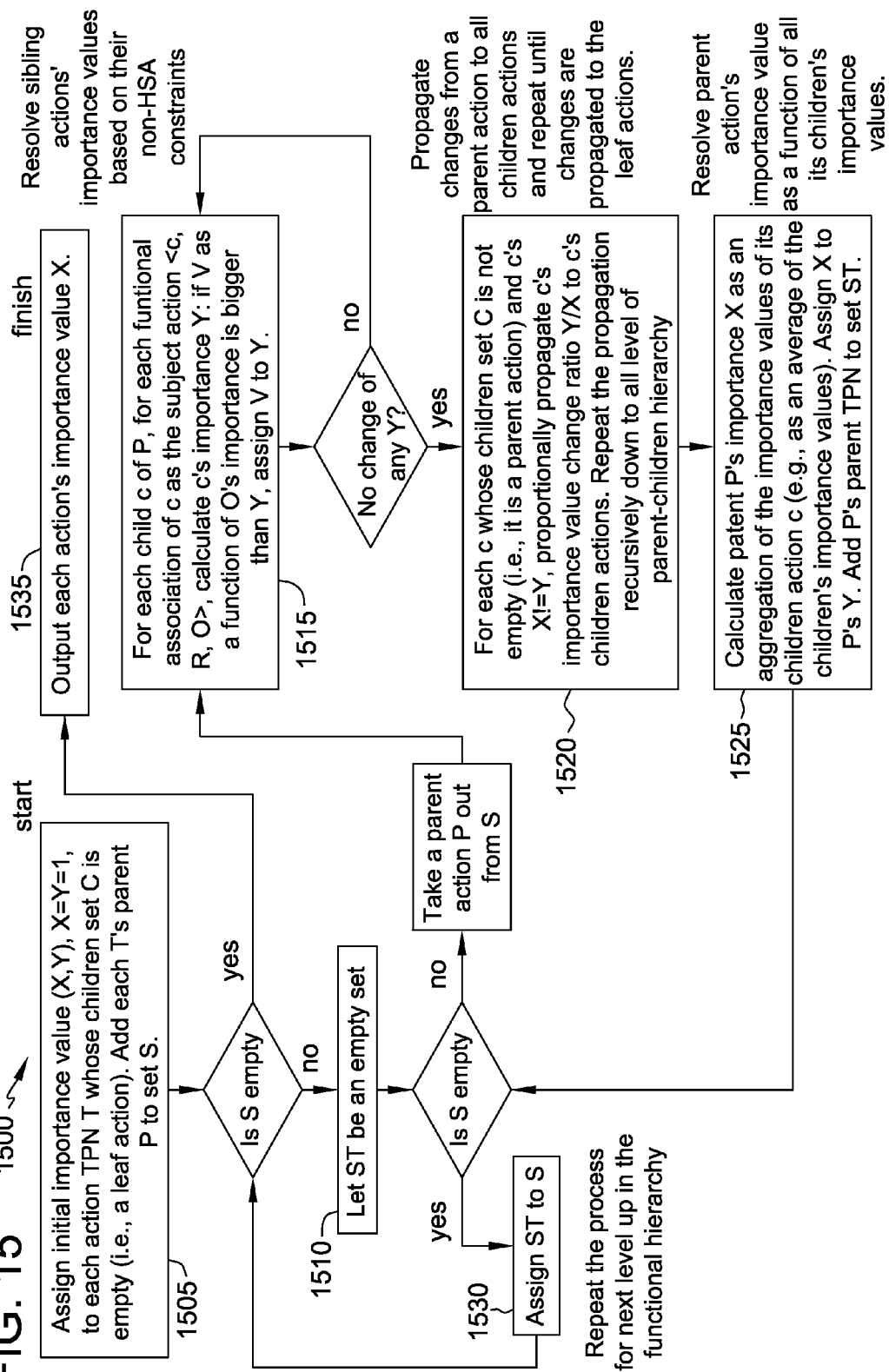
FIG. 15 is a flowchart of an exemplary QoS Importance Analysis algorithm.

In exemplary embodiments, Mission QoS Reasoner 310 performs 1410 the exemplary QoS Importance Analysis algorithm, using formal mission models 325 (e.g., composite TPN model 330 and functional hierarchy 335), an aggregation formula $V_{HSA}$ for combining the importance of child actions, and the Importance Value Assignment formula $V_R$ for each non-HSA functional association R (see examples in Table 3), as input. FIG. 15 is a flowchart of the exemplary QoS Importance Analysis algorithm described below. The algorithm is as follows:

1. Let S be the empty set { }.
2. For each action $A_i$'s TPN $T_i$ whose associated $C_i$ is empty, do:
   2.a. At step 1505, assign the initial importance value $X_i = Y_i = 1$ for the TPN $T_i$. (In other exemplary embodiments, Mission QoS Reasoner 310 may assign a different initial value than 1 here, e.g., based on configuration or user input, while the rest of the algorithm remains the same.)

2.b. Add $P_i$ (i.e., parent of the action $T_i$) to the set S if $P_i$ is not already in S.

3. While S is not empty, do:

3.a. At step 1510, let $S_T$ be the empty set { }.

3.b. For each TPN $T_i$ in the set S, do:

3.b.i. Let $S_C$ be the set of basic TPNs in $C_i$.

3.b.ii. For each TPN $T_S$ (of action $A_S$) in $S_C$, do:

3.b.ii.1 For each functional association $<A_S,R,A_O>$ in $F_S$, do:

3.b.ii.1.a. Let $T_O$ be the TPN for the object action $A_O$.

3.b.ii.1.b. At step 1515, if $T_O$ is also in $S_C$ and $Y_S<V_R(Y_O)$, assign $Y_S=V_R(Y_O)$. (Update the importance value of the TPN $T_S$ using the importance value of the TPN $T_O$ according to Importance Value Assignment formula of the functional association. When $A_S$ has a functional association with multiple $A_O$s, the largest importance value is assigned, i.e., $Y_S=V_R(Y_O)$ only if $Y_S<V_R(Y_O)$.)

3.b.iii Repeat the step 3.b.ii (including its sub-steps 3.b.ii.1, 3.b.ii.1.a, 3.b.ii.1.b) until there is no change of the importance value $Y_k$ for any TPN $T_S$ in $S_C$.

3.b.iv. At step 1520, for each TPN $T_k$ in $S_C$ such that $C_k$ is not empty and $X_k!=Y_k$, do:

3.b.iv.1. Let the queue Q initially include all TPNs in $C_k$.

3.b.iv.2 While Q is not empty, do:

3.b.iv.2.a. Dequeue a TPN $T_d$ from Q.

3.b.iv.2.b. Update $X_d$ using $X_d*Y_k/X_k$.

3.b.iv.2.c. Add all TPNs in $C_d$ into Q.

3.b.v. At step 1525, calculate the importance value $X_i$ of the TPN $T_i$ by applying the aggregation formula $V_{HSA}$ on the importance $Y_k$ of each TPN $T_k$ in $S_C$.

3.b.vi. Initialize $Y_i=X_i$.

3.b.vii. Add the TPN $P_i$ to the set $S_T$ if $P_i$ is not already in $S_T$.

3.c. At step 1530, let $S=S_T$.

4. At step 1535, the final importance value for each action $A_i$ is stored in the variable $X_i$.

Figure 16:
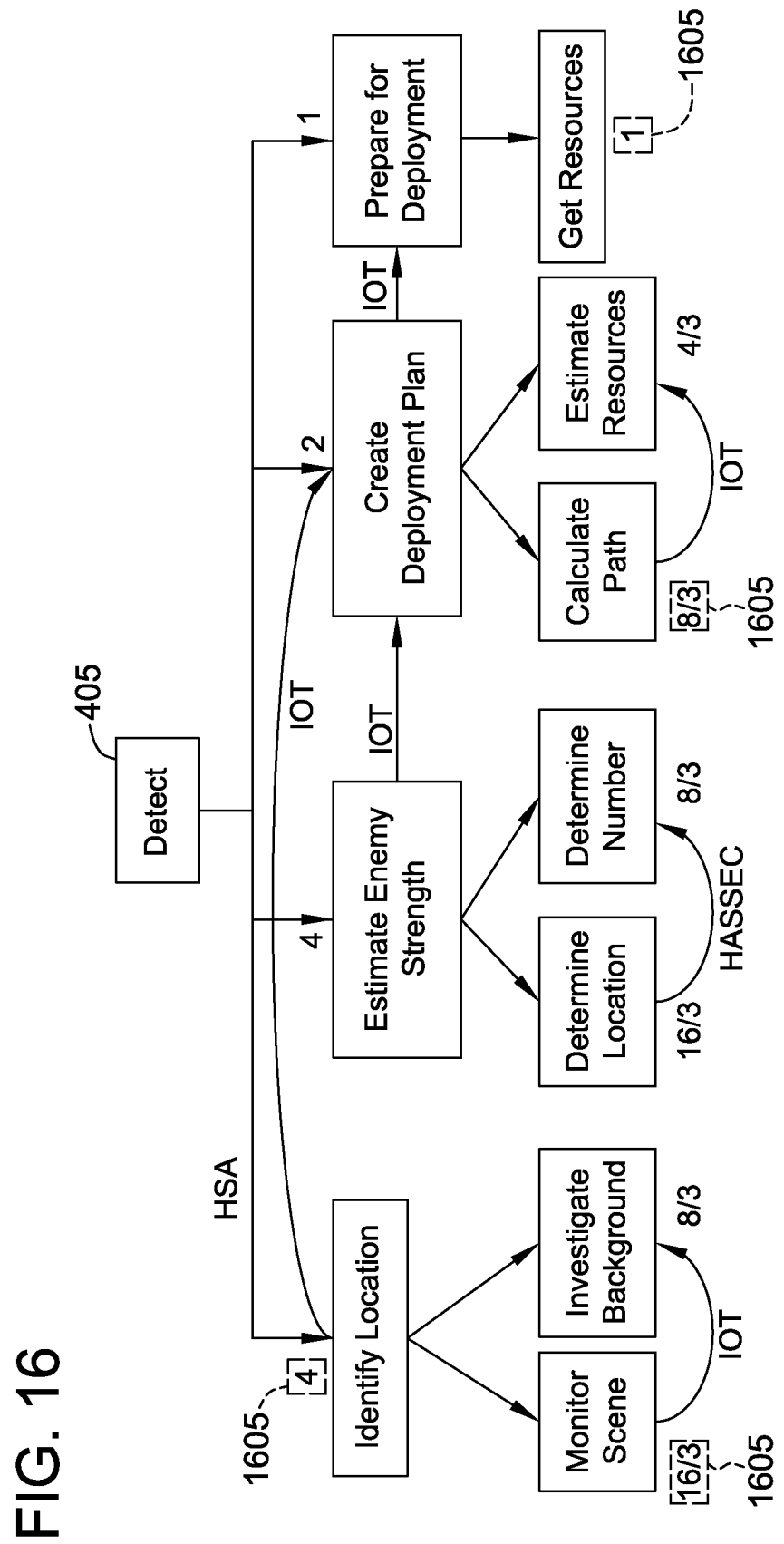
FIG. 16 is an illustration of the detect phase shown in FIG. 4 with calculated importance values indicated.

By performing 1410 the QoS Importance Analysis algorithm, Mission QoS Reasoner 310 outputs the importance values for each action $A_i$'s TPN T. FIG. 16 is an illustration of detect phase 405 (described above with reference to FIG. 4) of the exemplary search and rescue scenario with calculated importance values 1605 indicated.

Once urgency and importance values are derived for actions in a mission, Mission QoS Reasoner generates 1415 QoS policies controlling task allocation, admission, resource allocation, and adaptation in the runtime system. Typically, the task and resource allocation strategy depends on the types of mission systems and the actions to be executed. As a result, the generation 1415 of QoS polices may be based on the targeted type of mission systems. Available mission systems may be categorized into a small number of known paradigms. For example, one type is a messaging system in a publish-subscribe paradigm. Another is a tasking system in an object request broker paradigm. The publish-subscribe paradigm focuses on resources such as message queues and their properties such as size, priority, and persistence. The object request broker paradigm focuses on resources, such as threads and processes, and their properties, such as thread pool size and thread priority. To illustrate the generation 1415 of QoS polices in a mission-driven QoS management approach, the publish-subscribe paradigm is described below.

In the publish-subscribe type of mission systems, an action in the mission either publishes information of certain topics (e.g., as a publisher of a topic), or subscribes to information of certain topics (e.g., as a subscriber of a topic), or both. In other words, an action may include one or more publishers and subscribers, where each publisher or subscriber specifies a topic and the characteristics of the to-be-published/subscribed information objects. Example characteristics include object size, update rate, time-to-live, etc. In addition, each action has the following properties: importance (I), urgency (U), and requested resources (CPU, communication bandwidth, storage, battery, etc). Table 5 shows a sample Importance and Urgency Pairs (I, U) for actions in a mission. Note that there could be multiple actions having the same (I, U) pair and thus occupying the same cell.

TABLE 5

| (I, U) | 1 | 2 | 3 | 4 | 5 | 6 | 7 | 8 | 9 | 10 |
|---|---|---|---|---|---|---|---|---|---|---|
| 1 | (1, 1) |  | (1, 3) |  |  |  |  |  |  |  |
| 2 |  |  | (2, 3) |  |  |  |  |  |  |  |
| 3 | (3, 1) | (3, 2) |  |  | (3, 5) |  |  |  |  |  |
| 4 | (4, 1) |  | (4, 3) |  |  |  | (4, 7) |  |  |  |
| 5 |  |  |  |  |  |  |  |  | (5, 9) |  |
| 6 |  |  |  | (6, 4) |  |  |  |  |  |  |
| 7 |  |  |  |  |  |  |  | (7, 8) |  |  |
| 8 |  |  |  |  |  | (8, 6) |  |  |  |  |
| 9 |  |  |  |  |  |  |  |  |  | (9, 10) |
| 10 |  |  |  |  |  |  |  |  | (10, 9) | (10, 10) |

Furthermore, the number of message topics in the publish-subscribe type of mission systems is often small. For example, Table 6 shows a sample list of topics and their initial assigned (I, U) values according to a mission commander's intent. Alternatively, all topics could have equal (I, U) value, e.g., (1, 1) in the initial settings by default.

TABLE 6

| Topics | Initial (I, U) |
|---|---|
| Combat | (10, 8) |
| Logistics | (8, 5) |
| Sensor Report | (7, 7) |
| Non-combat Chat | (1, 5) |

In the publish-subscribe type of mission systems, each publisher/subscriber will be assigned with a queue (which could be shared) to hold messages from/to the publisher/ subscriber, respectively. Similarly, a Topic will also be assigned with a queue to hold messages for that topic. Each queue has a size and a priority to be determined at runtime by the QoS Policies which are generated by Mission QoS Reasoner 310. A publisher/subscriber's (I, U) pair is inherited from its corresponding action's (I, U). A topic's (I, U) has an initial (default) assignment and will be updated based on the publisher/subscriber's (I, U) of that topic.

In exemplary embodiments, policy templates are created for the publish-subscribe type of mission systems. Mission QoS Reasoner 310 generates policies by setting appropriate values for the variables in the template. Table 7 includes sample policy templates, where x, y, a, b, c, p, s, t, and w are variables with their domains as follows: [1, 10] for x, y, a, and b; [1, 15] for p, {500, 1000, 1500} for s, {true, false} for t, and [1,100] for w. For c, the domain is the list of supported topics in a mission such as those shown in Table 6.

TABLE 7

| Template | Conditions | Actions |
|---|---|---|
| A-Client | (Role="Publisher" or Role="Subscriber") AND x <= requested I <= y AND a <= requested U <= b | Assign size = s; sharable = t; priority = p for the client's queue |
| B-Topic | Topic=c | Assign size = s; priority = p for c's queue |
| C-Topic | Role="Publisher" AND Topic = c AND c's priority + 2% of the requester's priority is smaller than c's priority limit p | Add 2% of the requester's priority to c's priority |
| D-Topic | Role="Subscriber" AND Topic = c AND c's priority + 1% of the requester's priority is smaller than c's priority limit p | Add 1% of the requester's priority to c's priority |
| E-Admission | Role="Publisher" AND requested bandwidth >=w% of system available bandwidth AND x<=requested I <=y AND & a<=requested U <=b | Deny admission for the request |
| F-Adaptation | Role="Publisher" AND requested CPU>= w% of system available CPU AND x<= requested I <=y AND a<= requested U <=b AND there exists a client E in the system whose importance $I_E$ <x and urgency $U_E$<a | Reduce client E's priority by $(x - I_E)^* (a - U_E)/(I_E * U_E)$. |

Before policy generations for each computing node supporting the mission, the actions in the mission must be allocated to the set of distributed and networked computing nodes in the system. The task allocation problem has been widely studied, and tasks may be allocated to nodes by Mission QoS Reasoner 310 according to known methods. Without loss of generality, given a set of n actions $\{A_1, A_2, \ldots, A_n\}$ in the mission, and a set of m nodes $\{N_1, N_2, \ldots, N_m\}$, let $S_k$ denote the subset of actions allocated to node $N_k$ for k=1, ..., m. At this point, a table of importance and urgency pairs, similar to Table 5, is created for actions in $S_k$ on node $N_k$. Note multiple actions may have identical (I, U) pairs and thus occupy the same cell in the table.

Once the tasks are allocated, Mission QoS Reasoner 310 generates 1415 and outputs 1420 mission QoS policies 340. An exemplary algorithm for generating 1415 mission QoS policies 340 for the publish-subscribe type of mission systems is as follows. Note that the algorithm described uses the policy templates as in Table 7. It can be easily adapted to support different policy templates. In this algorithm, a set of importance and urgency (I, U) pairs are often partitioned into a few groups. Note that the (I, U) pairs have 10*10=100 possible combinations as both I and U ranges within [1, 10]. These 100 combinations can be merged into a given number of groups using a specified clustering algorithm with a configurable distance function defined on the (I, U) pair. By default, the distance function $f((I_1, U_1), (I_2, U_2))$ is defined as $(I_1-I_2)^2+(U_1-U_2)^2$. Furthermore, the resulting groups from the clustering algorithm are ordered ascendingly by another configurable function. By default, the ordering function is defined as $I_a^2+U_a^2$, where $I_a$ and $U_a$ are averaged values for I's and U's in the group. For clarity and without loss of generality in the remainder of the description, assume the actions in a mission are clustered into 3 ordered groups G1, G2, and G3.

The algorithm below operates on input including composite TPN model 330, the derived urgency and importance values for all actions, and the clustering algorithm for partitioning the importance and urgency pairs. The output is a set of mission QoS policies 340 specified for each computing node $N_k$ with three segments: Admission Control, Resource Allocation and Adaptation.

1. Generate the Admission Control policy segment (using notional threshold values) for each node $N_k$ as follows:

1.a. Given the set of actions $S_k$ on node $N_k$, calculate total bandwidth request R from all actions. Compare R with system bandwidth limit T on node $N_k$ and classify level of the total bandwidth request R as follows: High if R is greater than 80% of T; Medium if R is not High and greater than 40% of T; Low otherwise.

1.b. If R is High, set w=20, x=1; y=3; a=1, b=3 in the E-Admission policy template. As a result, an admission control policy is generated with the following conditions and actions:

1.b.i. Conditions: Role="Publisher" AND the requested bandwidth >=20% of the system available bandwidth AND 1<=requested I<=3 AND 1<=requested U<=3.

1.b.ii. Actions: Deny admission.

1.b.iii. In other words, given high demand on bandwidth by the actions in the mission, deny admission to a publisher that has low importance and low urgency values but high (20% of total) bandwidth demand. Note the system available bandwidth is measured at runtime by the Policy Manager 215 (described above with reference to FIG. 2). Thus a client whose request is denied may try the same request again later and may be admitted when the system available bandwidth is increased (e.g., due to completion of another client).

1.c. Similarly, variables are set and polices are generated for other levels of R (Medium and Low).

2. Generate the Resource Allocation policy segment (using notional threshold values) as follows:

2.a. Create a Resource Allocation policy segment for requests with (I,U) pair in G1 as follows: set x and y as the smallest I and the biggest I respectively in G1, a and b as the smallest U and the biggest U respectively in G1, set s=500, t=True, and p=round((x+y)/20*(a+b)/20*15) in A-Client template in Table 7 to generate the policy with the following conditions and actions (round is the mathematical function to take the nearest integer from a real number):

2.a.i. Conditions: Role="Publisher" or "Subscriber" AND x<=requested I<=y AND a<=requested U<=b.

2.a.ii. Actions: assign queue size=500; sharable=True and priority=((x+y)/20*(a+b)/20*15).

2.b. Create a Resource Allocation policy segment for requests with (I,U) pair in G2 as follows: set x and y as the smallest I and the biggest I respectively in G2, a and b as the smallest U and the biggest U respectively in G2, set s=1000, t=False, and p=round((x+y)/20*(a+b)/20*15) in A-Client template in Table 7 to generate the policy with the following conditions and actions:

2.b.i. Conditions: Role="Publisher" or "Subscriber" AND x<=requested I<=y AND a<=requested U<=b.

2.b.ii. Actions: assign queue size=1000; sharable=False; priority=round((x+y)/20*(a+b)/20*15).

2.c. Create a Resource Allocation policy segment for requests with (I, U) pair in G3 as follows: set x and y as the smallest I and the biggest I respectively in G2, a and b as the smallest U and the biggest U respectively in G2, set s=1500, t=False, and p=round((x+y)/20*(a+b)/20*15) for A-Client template in Table z to generate policy with the following conditions and actions:

2.c.i. Conditions: Role="Publisher" or "Subscriber" AND x<=requested I<=y AND a<=requested U<=b.

2.c.ii. Actions: assign queue size=1500; sharable=False; priority=round((x+y)/20*(a+b)/20*15).

2.d. Summarize all the topics of publications/subscriptions in the actions $S_k$ on node $N_k$ and create a table of the importance and urgency pairs for the topics, as illustrated in Table Y. For each topic c, determine whether publishers and subscribers for the topic c are predominately in ordered groups G1, G2, or G3. If publishers and subscribers for the topic c are equally distributed in ordered groups G1, G2, and G3, set G2 as c's group. Apply template B-Topic in Table 7 to generate a policy for each topic c with the following conditions and actions:

2.d.i. Conditions: Topic=c.

2.d.ii. Actions: set s=500, 1000, or 1500 for c's group G1, G2, or G3, respectively; set p=round((x+y)/20*(a+b)/20*15) where x and y be the smallest I and the biggest I respectively, a and b be the smallest U and the biggest U respectively in c's group G1, G2, G3, respectively.

2.e. Similar policies are generated using templates C-Topic and D-Topic in Table 7. For example, for each topic c, say c="Logistics", a policy is generated for all it Subscribers with the following conditions and actions:

2.e.i. Conditions: Role="Subscriber" AND Topic="Logistics".

2.e.ii. Actions: get Topic's priority p1, get Role's priority p2, assign p1+p2*1% to p1 if p1+p2*1%<15.

3. Generate the Adaptation policy segment (using notional threshold values) as follows:

3.a. Given the set of actions $S_k$ on node $N_k$ and the table of importance and urgency pairs for the actions $S_k$, calculate total CPU request R on from all actions. Compare R with maximum system available CPU T node $N_k$ and classify the level of total CPU request R follows: High if R is greater than 80% of T; Medium if R is not High and greater than 40% of T; Low otherwise.

3.b. Partition the importance and urgency (I, U) pairs of all actions $S_k$ into three ordered groups G1, G2 and G3 using the clustering algorithm.

3.c If R is High, set w=20, x and y be the smallest I and the largest I in G3 respectively, a and b be the smallest U and the largest U in G3 respectively, using the F-Adaptation template in Table 7 to generate the adaptation policy segment with the following conditions and actions:

3.c.1. Conditions: Role="Publisher" AND the requested CPU>=20% system available CPU; x<=requested I<=y AND a<=requested U<=b AND there exists an existing client E in the system whose importance $I_E$<x and urgency $U_E$<a.

3.c.2. Actions: reduce E's priority by $(y-I_E)*(a-U_E)/(I_E*U_E)$.

3.d. Similarly, variables are set and polices are generated using G2 and G1 respectively. Repeat the same step 3.b. (and its sub-steps) when R is Medium or Low.

By performing the above policy generation algorithm, Mission QoS Reasoner 310 outputs the mission QoS policies 340. At runtime, The QoS Manager services will execute on the generated policies and perform any transformations as required by the QoS management algorithm used. For example in the WF2Q+ algorithm, a queue q, will be assigned a weight $w_i$ which is calculated from the assigned priorities of all queues $p_1, p_2, \ldots, p_n$ as $w_i=p_i/(p_1+ \ldots +p_n)$.

Mission Coordinator

To be applied in a NMCS, mission QoS policies 340 are disseminated to individual computing nodes within the NMCS. As shown in FIG. 3, mission QoS policies 340 derived by Mission QoS Reasoner 310 are provided to QoS management architecture 200 (shown in FIG. 2) in near real-time for enforcement.

Figure 17:
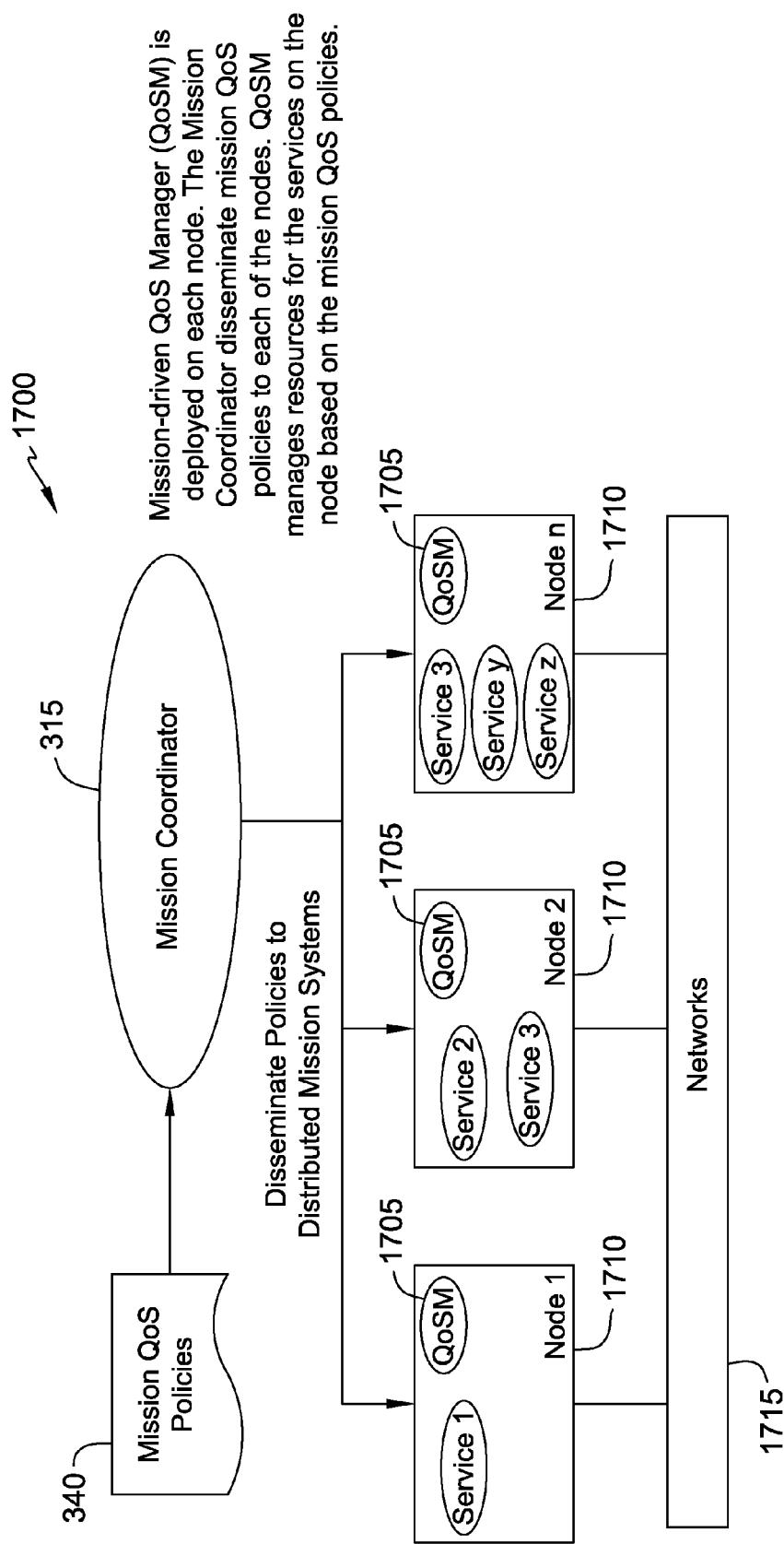
FIG. 17 is a block diagram of the Mission Coordinator shown in FIG. 3 disseminating (e.g., transmitting) mission QoS policies to runtime QoS Management services (QoSM) on a plurality of computing nodes on a network.

FIG. 17 is a block diagram 1700 of Mission Coordinator 315 disseminating (e.g., transmitting) mission QoS policies 340 to runtime QoS Management services (QoSM) 1705 on a plurality of computing nodes 1710 on a network 1715. For example, computing nodes 1710 may be distributed mission systems (e.g., separated geographically and/or by network location) connected to network 1715.

Experimental Data

Described herein is a mission-driven QoS management approach for networked mission critical system (NMCS). This approach consists of a method, an architecture, processes, algorithms, and a set of techniques.

The approach was implemented as a prototype, and the sample mission scenarios were executed. Performance data were collected and compared against those of a baseline (best-effort) case, in which tasks were treated by the information system with no QoS differentiation. Two performance parameters were used to compare the mission-driven QoS managed case against the best-effort case: 1) total mission execution time; and 2) total delivered value. The total delivered value is the summation of each action k's delivered value. The delivered value of an action is calculated as the importance value I of the action multiplied by the urgency value U of the action, then multiplied by the difference between the mean delay D and the actual delay d in executing the action, and finally divided by the mean delay D. Equation 3 represents the total delivered value.

$$f = \sum_{k=1}^{n} I_k * U_k \frac{D_k - d_k}{D_k} \qquad \text{(Eq. 3)}$$

The mean delay of an action is obtained by averaging the actual delays of that action in multiple execution runs without mission-driven QoS management (i.e., best effort). An actual delay higher than the mean delay (i.e., worse than average) will generate negative delivered value, and an actual delay lower than the mean delay (i.e., better than average) will generate positive delivered value. The total delivered value f is designed to achieve global mission-wide optimality. This metric is an indication of effectiveness of different QoS management policies, including best effort, manually created policies, and the policies generated by our mission-driven QoS approach. Furthermore, f can be divided by the sum of I to determine the weighted average of the delay variances.

Analysis results have shown that the described mission-driven QoS management approach outperforms the best-effort case in both metrics. The positive experiment results corroborate that the mathematical modeling and analysis, as well as policy generation techniques, are valid and sound. The tested prototype not only automated the process of formal mission model generation, analysis, and policy generation, but also achieved optimal mission execution through formal analysis.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for determining quality of service (QoS) policies based on a mission representation, the method comprising:
   receiving, by a computing device, a mission representation including a plurality of actions in a mission and temporal and functional associations between the actions, wherein the actions are to be executed using a plurality of computing nodes;
   generating, by the computing device, a Time Petri Net (TPN) model of the mission based on the mission representation, wherein the TPN model represents the actions in the mission, temporal constraints for the actions, and functional associations between the actions;
   determining, by the computing device, an importance value and an urgency value associated with each action based on the TPN model, wherein the urgency value is determined based on a derived start time and a slack of the action; and
   generating, by the computing device, one or more QoS policies based on the importance values and the urgency values of the actions, wherein the QoS policies are applied to the computing nodes within which the actions are executed.

2. A method in accordance with claim 1, further comprising generating the temporal constraints for one or more of the actions based on the temporal associations in the mission representation, wherein the constraints include a comparison of a value to one or more of the following: a start time, a finish time, and a duration.

3. A method in accordance with claim 1, wherein generating the TPN model comprises:
   for each action in mission representation, generating a TPN model including:
   a ready place;
   a processing place;
   a finished place;
   a first transition from the ready place to the processing place; and
   a second transition from the processing place to the finished place; and
   for each temporal association and each functional association that associates actions in the mission representation, generating a composite TPN model based on the TPN models corresponding to the associated actions.

4. A method in accordance with claim 3, wherein generating the TPN model further comprises:
   extracting from the mission representation a list of temporal associations between the actions; and
   for each temporal association in the list of temporal associations:
   creating a bridge TPN model based on one or more temporal constraints of the temporal association; and
   linking a subject action of the temporal association and an object action of the temporal association using the bridge TPN model to create a composite TPN model.

5. A method in accordance with claim 4, wherein creating the bridge TPN model based on a temporal constraint comprises creating:
   a first bridge place;
   a second bridge place;
   a bridge transition from the first bridge place to the second bridge place;
   a time interval for the bridge transition; and
   based on a directionality of the temporal constraint, one of the following:
   a transition to the first bridge place from the first transition of the TPN model corresponding to the object action, and a transition from the second bridge place to the first transition of the TPN model corresponding to the subject action; and
   a transition to the first bridge place from the first transition of the TPN model corresponding to the subject action, and a transition from the second bridge place to the first transition of the TPN model corresponding to the object action.

6. A method in accordance with claim 3, wherein generating the TPN model further comprises:
   extracting from the mission representation a list of functional associations between the actions; and
   for each functional association in the list of functional associations:
   setting one or more properties of the subject action of the functional association according to the functional association; and
   setting one or more properties of the object action of the functional association according to the functional association.

7. A method in accordance with claim 3, wherein generating the TPN model further comprises determining a transition time bounded by an action duration associated with the second transition from the processing place to the finished place.

8. A method in accordance with claim 1, wherein determining an importance value associated with each action comprises determining an importance value based on functional associations between the actions.

9. A method in accordance with claim 1, further comprising distributing at least a portion of the generated QoS policies to each computing node of the plurality of computing nodes.

10. A device for use with a networked mission system, the device comprising:
    a memory for storing a mission representation including:
    a plurality of actions in a mission; and
    temporal and functional associations between the actions, wherein the actions are to be executed using a plurality of computing nodes;
    a processor unit coupled to the memory and programmed to:
    generate a Time Petri Net (TPN) model of the mission based on the mission representation, wherein the TPN model represents the actions in the mission, temporal constraints for the actions, and functional associations between the actions;
    determine an importance value and an urgency value associated with each action based on the TPN model, wherein the urgency value is determined based on a derived start time and a slack of the action; and
    generate one or more QoS policies based on the importance values and the urgency values of the actions, wherein the QoS policies are applied to the computing nodes.

11. A device in accordance with claim 10, wherein the processor unit is further programmed to generate the temporal constraints for one or more of the actions based on the temporal associations in the mission representation, wherein the constraints include a comparison of a value to one or more of the following: a start time, a finish time, and a duration.

12. A device in accordance with claim 10, wherein the processor unit is programmed to generate the TPN model at least in part by,
for each action in mission representation, generating a TPN model including:
a ready place;
a processing place;
a finished place;
a first transition from the ready place to the processing place; and
a second transition from the processing place to the finished place; and
for each temporal association and each functional association that associates actions in the mission representation, generating a composite TPN model based on the TPN models corresponding to the associated actions.

13. A device in accordance with claim 12, wherein the processor unit is programmed to generate the TPN model by further:
extracting from the mission representation a list of temporal associations between the actions; and
for each temporal association in the list of temporal associations:
creating a bridge TPN model based on one or more temporal constraints of the temporal association; and
linking a subject action of the temporal association and an object action of the temporal association using the bridge TPN model to create a composite TPN model.

14. A device in accordance with claim 12, wherein the processor unit is programmed to generate the TPN model by further:
extracting from the mission representation a list of functional associations between the actions; and
for each functional association in the list of functional associations:
setting one or more properties of the subject action of the functional association according to the functional association; and
setting one or more properties of the object action of the functional association according to the functional association.

15. A device in accordance with claim 12, wherein the processor unit is programmed to determine a transition time bounded by an action duration associated with the second transition from the processing place to the finished place.

16. A device in accordance with claim 10, wherein the processor unit is programmed to determine an importance value associated with each action at least in part by determining an importance value based on functional associations between the actions.

17. A device in accordance with claim 10, wherein the processor unit is programmed to distribute at least a portion of the generated QoS policies to each computing node of the plurality of computing nodes.

18. A storage device having embodied thereon computer-executable instructions that, when executed by a processor unit, cause the processor unit to:
receive a mission representation including a plurality of actions in a mission and temporal and functional associations between the actions, Wherein the actions are to be executed using a plurality of computing nodes;
generate, by the processor unit, a Time Petri Net (TPN) model of the mission based on the mission representation, wherein the TPN model represents the actions in the mission, temporal constraints for the actions, and functional associations between the actions;
determine, by the processor unit, an importance value and an urgency value associated with each action based on the TPN model, wherein the urgency value is determined based on a derived start time and a slack of the action; and
generate, by the processor unit, one or more QoS policies based on the importance values and the urgency values of the actions, wherein the QoS policies are applied to the computing nodes.

19. A storage device in accordance with claim 18, wherein the computer-executable instructions further cause the processor unit to generate the temporal constraints for one or more of the actions based on the temporal associations in the mission representation, wherein the constraints include a comparison of a value to one or more of the following: a start time, a finish time, and a duration.

20. A storage device in accordance with claim 18 wherein the computer-executable instructions further cause the processor unit to:
extract from the mission representation a list of temporal associations between the actions; and
for each temporal association in the list of temporal associations:
create a bridge TPN model based on one or more temporal constraints of the temporal association; and
link a subject action of the temporal association and an object action of the temporal association using the bridge TPN model to create a composite TPN model.

21. A storage device in accordance with claim 18 wherein the computer-executable instructions further cause the processor unit to:
extract from the mission representation a list of functional associations between the actions; and
for each functional association in the list of functional associations:
setting one or more properties of the subject action of the functional association according to the functional association; and
setting one or more properties of the object action of the functional association according to the functional association.

22. A method for determining quality of service (QoS) policies based on a mission representation, the method comprising:
receiving, by a computing device, a mission representation including a plurality of actions in a mission and temporal and functional associations between the actions, wherein the actions are to be executed using a plurality of computing nodes;
generating, by the computing device, a Time Petri Net (TPN) model of the mission based on the mission representation, wherein the TPN model represents the actions in the mission, temporal constraints for the actions, and functional associations between the actions, wherein for each action in mission representation, the TPN model includes a ready place, a processing place, a finished place, a first transition from the ready place to the processing place, and a second transition from the processing place to the finished place;
extracting a list of temporal associations between the actions from the mission representation;
for each temporal association in the list of temporal associations, creating a bridge TPN model based on one or more temporal constraints of the temporal association, the bridge TPN including a first bridge place, a second bridge, place, a bridge transition from the first bridge place to the second bridge place, a time interval for the bridge transition, and based on a directionality of the temporal constraint, one of the following:
  a transition to the first bridge place from the first transition of the TPN model corresponding to an object action of the temporal association, and a transition from the second bridge place to the first transition of the TPN model corresponding to a subject action of the temporal association; and
  a transition to the first bridge place from the first transition of the TPN model corresponding to the subject action of the temporal association, and a transition from the second bridge place to the first transition of the TPN model corresponding to the object action of the temporal association;
determining, by the computing device, an importance value and an urgency value associated with each action based on the TPN model; and
generating, by the computing device, one or more QoS policies based on the importance values and the urgency values of the actions, wherein the QoS policies are applied to the computing nodes within which the actions are executed.

23. A method for determining quality of service (QoS) policies based on a mission representation, the method comprising:
receiving, by a computing device, a mission representation including a plurality of actions in a mission and temporal and functional associations between the actions, wherein the actions are to be executed using a plurality of computing nodes;
generating, by the computing device, a Time Petri Net (TPN) model of the mission based on the mission representation, wherein the TPN model represents the actions in the mission, temporal constraints for the actions, and functional associations between the actions, wherein for each action in the mission, the TPN model includes a transition from a processing place to a finished place, and a transition time is determined to be bounded by an action duration associated with the transition;
determining, by the computing device, an importance value and an urgency value associated with each action based on the TPN model; and
generating, by the computing device, one or more QoS policies based on the importance values and the urgency values of the actions, wherein the QoS policies are applied to the computing nodes within which the actions are executed.

24. A device for use with a networked mission system, the device comprising:
a memory for storing a mission representation including:
a plurality of actions in a mission; and
temporal and functional associations between the actions, wherein the actions are to be executed using a plurality of computing nodes;
a processor unit coupled to the memory and programmed to:
generate a Time Petri Net (TPN) model of the mission based on the mission representation, wherein the TPN model represents the actions in the mission, temporal constraints for the actions, and functional associations between the actions, wherein for each action in mission representation, the TPN model includes a ready place, a processing place, a finished place, a first transition from the ready place to the processing place, and a second transition from the processing place to the finished place;
extract a list of temporal associations between the actions from the mission representation;
for each temporal association in the list of temporal associations, create a bridge TPN model based on one or more temporal constraints of the temporal association, the bridge TPN including a first bridge place, a second bridge place, a bridge transition from the first bridge place to the second bridge place, a time interval for the bridge transition, and based on a directionality of the temporal constraint, one of the following:
  a transition to the first bridge place from the first transition of the TPN model corresponding to an object action of the temporal association, and a transition from the second bridge place to the first transition of the TPN model corresponding to a subject action of the temporal association; and
  a transition to the first bridge place from the first transition of the TPN model corresponding to the subject action of the temporal association, and a transition from the second bridge place to the first transition of the TPN model corresponding to the object action of the temporal association;
determine an importance value and an urgency value associated with each action based on the TPN model; and
generate one or more QoS policies based on the importance values and the urgency values of the actions, wherein the QoS policies are applied to the computing nodes.

25. A device for use with a networked mission system, the device comprising:
a memory for storing a mission representation including:
a plurality of actions in a mission; and
temporal and functional associations between the actions, wherein the actions are to be executed using a plurality of computing nodes;
a processor unit coupled to the memory and programmed to:
generate a Time Petri Net (TPN) model of the mission based on the mission representation, wherein the TPN model represents the actions in the mission, temporal constraints for the actions, and functional associations between the actions, wherein for each action in the mission representation, the TPN model includes a transition from a processing place to a finished place, and a transition time is determined to be bounded by an action duration associated with the transition;
determine an importance value and an urgency value associated with each action based on the TPN model; and
generate one or more QoS policies based on the importance values and the urgency values of the actions, wherein the QoS policies are applied to the computing nodes.

26. A storage device having embodied thereon computer-executable instructions that, when executed by a processor unit, cause the processor unit to:
receive a mission representation including a plurality of actions in a mission and temporal and functional associations between the actions, wherein the actions are to be executed using a plurality of computing nodes;
generate, by the processor unit, a Time Petri Net (TPN) model of the mission based on the mission representation, wherein the TPN model represents the actions in the mission, temporal constraints for the actions, and functional associations between the actions, wherein for each action in mission representation, the TPN model includes a ready place, a processing place, a finished place, a first transition from the ready place to the processing place, and a second transition from the processing place to the finished place;

extract a list of temporal associations between the actions from the mission representation;

for each temporal association in the list of temporal associations, create a bridge TPN model based on one or more temporal constraints of the temporal association, the bridge TPN including a first bridge place, a second bridge place, a bridge transition from the first bridge place to the second bridge place, a time interval for the bridge transition, and based on a directionality of the temporal constraint, one of the following:
- a transition to the first bridge place from the first transition of the TPN model corresponding to an object action of the temporal association, and a transition from the second bridge place to the first transition of the TPN model corresponding to a subject action of the temporal association; and
- a transition to the first bridge place from the first transition of the TPN model corresponding to the subject action of the temporal association, and a transition from the second bridge place to the first transition of the TPN model corresponding to the object action of the temporal association;

determine, by the processor unit, an importance value and an urgency value associated with each action based on the TPN model; and generate, by the processor unit, one or more QoS policies based on the importance values and the urgency values of the actions, wherein the QoS policies are applied to the computing nodes.

27. A storage device having embodied thereon computer-executable instructions that, when executed by a processor unit, cause the processor unit to:

receive a mission representation including a plurality of actions in a mission and temporal and functional associations between the actions, wherein the actions are to be executed using a plurality of computing nodes;

generate, by the processor unit, a Time Petri Net (TPN) model of the mission based on the mission representation, wherein the TPN model represents the actions in the mission, temporal constraints for the actions, and functional associations between the actions, wherein for each action in the mission, the TPN model includes a transition from a processing place to a finished place, and a transition time is determined to be bounded by an action duration associated with the transition;

determine, by the processor unit, an importance value and an urgency value associated with each action based on the TPN model; and generate, by the processor unit, one or more QoS policies based on the importance values and the urgency values of the actions, wherein the QoS policies are applied to the computing nodes.

* * * * *